(12) United States Patent
Matsuura et al.

(10) Patent No.: US 7,912,148 B2
(45) Date of Patent: Mar. 22, 2011

(54) TRANSMISSION CIRCUIT AND COMMUNICATION DEVICE

(75) Inventors: Toru Matsuura, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 906 days.

(21) Appl. No.: 11/878,902

(22) Filed: Jul. 27, 2007

(65) Prior Publication Data
US 2008/0031381 A1   Feb. 7, 2008

(30) Foreign Application Priority Data

Aug. 4, 2006   (JP) ................................ 2006-213699

(51) Int. Cl.
*H04K 1/02* (2006.01)
*H04L 25/03* (2006.01)
*H04L 25/49* (2006.01)
(52) U.S. Cl. ...................................................... 375/296
(58) Field of Classification Search .................. 375/260, 375/261, 265, 295, 296, 297, 300, 302, 316; 455/91, 102, 108, 109, 110, 126, 522
See application file for complete search history.

(56) References Cited

U.S. PATENT DOCUMENTS

| | | | | |
|---|---|---|---|---|
| 6,813,319 B1* | 11/2004 | Nagle et al. | ..................... | 375/302 |
| 6,998,919 B2 | 2/2006 | Gamero et al. | | |
| 2004/0036530 A1* | 2/2004 | Matsuura et al. | ............... | 330/10 |
| 2004/0038648 A1* | 2/2004 | Matsuura et al. | ............. | 455/101 |
| 2004/0219891 A1* | 11/2004 | Hadjichristos | ............... | 455/102 |
| 2005/0164660 A1 | 7/2005 | Matsuura et al. | | |
| 2005/0195918 A1* | 9/2005 | Matsuura et al. | ............. | 375/295 |
| 2005/0215209 A1* | 9/2005 | Tanabe et al. | .............. | 455/127.1 |
| 2006/0159198 A1 | 7/2006 | Morimoto et al. | | |

FOREIGN PATENT DOCUMENTS

| | | |
|---|---|---|
| JP | 2005-244950 | 9/2005 |
| JP | 2006-140911 | 6/2006 |
| WO | 2005/104352 | 11/2005 |

OTHER PUBLICATIONS

International Search Report mailed Oct. 9, 2007 for International Application No. PCT/JP2007/064757.

\* cited by examiner

*Primary Examiner* — David C Payne
*Assistant Examiner* — Syed Haider
(74) *Attorney, Agent, or Firm* — Wenderoth, Lind & Ponack, L.L.P.

(57) ABSTRACT

A transmission circuit precisely compensates for an offset characteristic of an amplitude modulation section and operates with low distortion and high efficiency over a wide output power range. A signal generation section outputs an amplitude signal and an angle-modulated signal. An amplitude amplifying section supplies, to the amplitude modulation section, a voltage corresponding to a magnitude of an inputted amplitude signal. The amplitude modulation section amplitude-modulates the angle-modulated signal by the voltage supplied from the amplitude amplifying section, thereby outputting a resultant signal as a modulation signal. A temperature measuring section measures a temperature of the amplitude modulation section. An offset compensation section calculates an offset compensation value in accordance with a change, in temperature of the amplitude modulation section, from the temperature of the amplitude modulation section in an initial state, and adds the calculated offset compensation value to the amplitude signal.

17 Claims, 20 Drawing Sheets

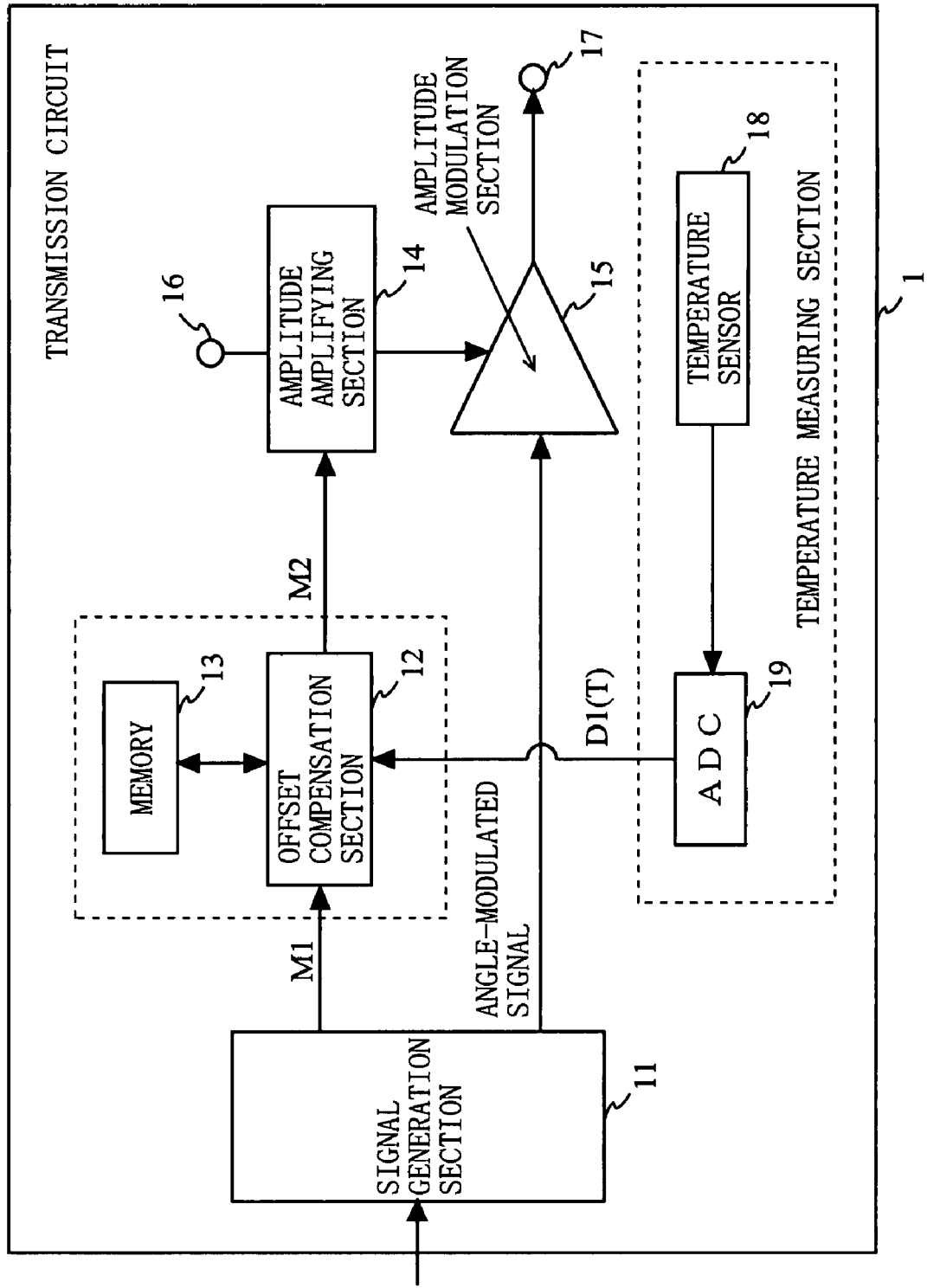
F I G. 1

FIG. 3C

OFFSET REFERENCE VALUE

DIGITAL VALUE $D1(T_0)$

OFFSET COMPENSATION VALUE $D2(T_0)$

| FREQUENCY BAND | f1 | f2 |
|---|---|---|
| GRADIENT $\alpha$ OF $\Delta D2(T)$ WITH RESPECT TO $\Delta D1(T)$ | $\alpha 1$ | $\alpha 2$ |

FIG. 3D

OFFSET REFERENCE VALUE

DIGITAL VALUE $D1(T_0)$

OFFSET COMPENSATION VALUE $D2(T_0)$

| OUTPUT POWER | P1 | P2 | P3 | P4 | P5 | P6 |
|---|---|---|---|---|---|---|
| GRADIENT $\alpha$ OF $\Delta D2(T)$ WITH RESPECT TO $\Delta D1(T)$ | $\alpha 11$ | $\alpha 12$ | $\alpha 13$ | $\alpha 14$ | $\alpha 15$ | $\alpha 16$ |

FIG. 11A

| OFFSET REFERENCE VALUES FOR AMPLITUDE MODULATION SECTION 15 |
|---|
| DIGITAL VALUE $D1(T_0)$ |
| OFFSET COMPENSATION VALUE $D2d(T_0)$ |
| GRADIENT $\alpha d$ OF $\Delta D2d(T)$ WITH RESPECT TO $\Delta D1(T)$ |

| OFFSET REFERENCE VALUES FOR AMPLITUDE MODULATION SECTION 25 |
|---|
| DIGITAL VALUE $D1(T_0)$ |
| OFFSET COMPENSATION VALUE $D2f(T_0)$ |
| GRADIENT $\alpha f$ OF $\Delta D2f(T)$ WITH RESPECT TO $\Delta D1(T)$ |

FIG. 11B

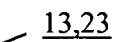

| OFFSET REFERENCE VALUES FOR AMPLITUDE MODULATION SECTION 15,25 |
|---|
| DIGITAL VALUE $D1(T_0)$ |
| OFFSET COMPENSATION VALUE $D2(T_0)$ |
| GRADIENT $\alpha d$ OF $\Delta D2(T)$ WITH RESPECT TO $\Delta D1(T)$ |
| GRADIENT $\alpha f$ OF $\Delta D2(T)$ WITH RESPECT TO $\Delta D1(T)$ |

F I G. 1 1 C 13,23

OFFSET REFERENCE VALUE

DIGITAL VALUE $D1(T_0)$

OFFSET COMPENSATION VALUE $D2(T_0)$

| FREQUENCY BAND | f1 | | | f2 | | |
|---|---|---|---|---|---|---|
| OUTPUT POWER | P1 | P2 | P3 | P1 | P2 | P3 |
| GRADIENT $\alpha d$ OF $\Delta D2(T)$ WITH RESPECT TO $\Delta D1(T)$ | $\alpha d11$ | $\alpha d12$ | $\alpha d13$ | $\alpha d21$ | $\alpha d22$ | $\alpha d23$ |
| GRADIENT $\alpha f$ OF $\Delta D2(T)$ WITH RESPECT TO $\Delta D1(T)$ | $\alpha f11$ | $\alpha f12$ | $\alpha f13$ | $\alpha f21$ | $\alpha f22$ | $\alpha f23$ |

F I G. 1 7 PRIOR ART
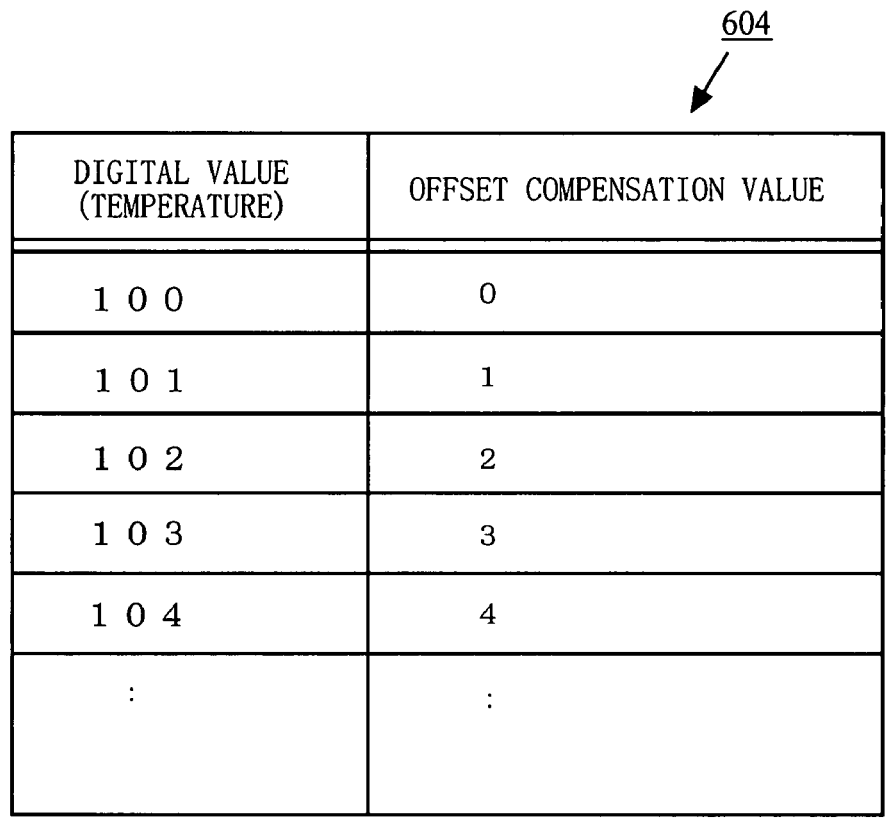
F I G. 1 8 PRIOR ART
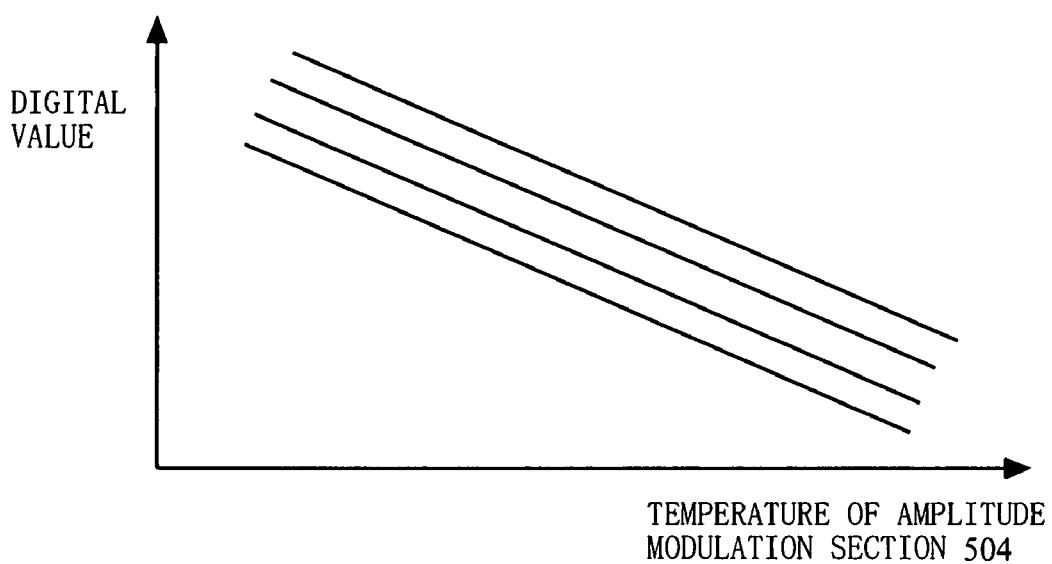

TRANSMISSION CIRCUIT AND COMMUNICATION DEVICE

BACKGROUND OF THE INVENTION

1. Field of the Invention

The present invention relates to a transmission circuit used for communication devices such as mobile phones and wireless LAN devices. The present invention particularly relates to a transmission circuit capable of operating with low distortion and high efficiency and a communication device using the transmission circuit.

2. Description of the Background Art

Communication devices such as mobile phones and wireless LAN devices are required to, even when operating over a wide bandwidth, secure precision of a transmission signal while operating with low power consumption. For such a communication device, a transmission circuit, which is capable of outputting a transmission signal with a high precision regardless of a bandwidth and operating with high efficiency, is used. Hereinafter, conventional transmission circuits will be described.

One of the conventional transmission circuits is, for example, a transmission circuit which uses a modulation method such as a quadrature modulation method to generate a transmission signal (hereinafter, referred to as a quadrature modulation circuit). Since the quadrature modulation circuit is well known, the description thereof will be omitted. A conventional transmission circuit, which is smaller in size and operates more efficiently than the quadrature modulation circuit, is, e.g., a transmission circuit 500 shown in FIG. 13. FIG. 13 is a block diagram showing an exemplary configuration of the conventional transmission circuit 500. In FIG. 13, the conventional transmission circuit 500 comprises a signal generation section 501, output terminal 502, amplitude amplifying section 503, amplitude modulation section 504 and a power supply terminal 505.

In the conventional transmission circuit 500, the signal generation section 501 outputs an amplitude signal and angle-modulated signal. The amplitude signal is inputted to the amplitude amplifying section 503. The amplitude amplifying section 503 supplies, to the amplitude modulation section 504, a voltage corresponding to a magnitude of the inputted amplitude signal. To the amplitude amplifying section 503, a DC voltage is supplied from the power supply terminal 505. Typically, the amplitude amplifying section 503 supplies, to the amplitude modulation section 504, a voltage proportional to the magnitude of the inputted amplitude signal.

The angle-modulated signal outputted from the signal generation section 501 is inputted to the amplitude modulation section 504. The amplitude modulation section 504 amplitude-modulates the angle-modulated signal by using the voltage supplied from the amplitude amplifying section 503 (i.e., collector voltage Vc), and outputs a resultant signal as a modulation signal having been angle-modulated and amplitude-modulated. This modulation signal is outputted from the output terminal 502 as a transmission signal. The transmission circuit 500 which operates in the above manner is called a polar modulation circuit.

The conventional transmission circuit 500 cannot always output a transmission signal with a high precision, depending on a characteristic of the amplitude modulation section 504. Described below with reference to FIG. 14 is a characteristic of the amplitude modulation section 504. FIG. 14 shows a relationship between the collector voltage Vc supplied to the amplitude modulation section 504 and an output voltage Vo. Here, a magnitude of an input voltage (angle-modulated signal) is fixed. When an HBT (Heterojunction Bipolar Transistor) is used as the amplitude modulation section 504, the amplitude modulation section 504 is, as shown in FIG. 14, unable to output, in a region where the collector voltage Vc is small, a modulation signal having a desired output voltage Vo. Hereinafter, this characteristic of the amplitude modulation section 504 is referred to as an offset characteristic.

The offset characteristic changes in accordance with a temperature in the amplitude modulation section 504. This change in the offset characteristic is mainly caused by a characteristic of the HBT (Heterojunction Bipolar Transistor) used for the amplitude modulation section 504. For example, the offset characteristic of the amplitude modulation section 504 changes when the temperature of the amplitude modulation section 504 changes from a low temperature to a room temperature, or from a room temperature to a high temperature. It is assumed in the example of FIG. 14 that the temperature of the amplitude modulation section 504 ranges from −25° C. to 120° C., and the room temperature is approximately 25° C. FIG. 14 shows an example in which a gradient of a line indicating the relationship between the collector voltage Vc and the output voltage Vo is fixed. However, there is a case where the gradient of the line changes in accordance with the temperature of the amplitude modulation section 504.

U.S. Pat. No. 6,998,919 (hereinafter, referred to as Patent Document 1) discloses a transmission circuit 600, which compensates for the offset characteristic of the amplitude modulation section 504 in accordance with the temperature of the amplitude modulation section 504. FIG. 15 is a block diagram showing an exemplary configuration of the conventional transmission circuit 600 disclosed in Patent Document 1. As shown in FIG. 15, the conventional transmission circuit 600 comprises the signal generation section 501, the output terminal 502, the amplitude amplifying section 503, the amplitude modulation section 504, the power supply terminal 505, a temperature sensor 601 and an offset compensation section 602. The temperature sensor 601 measures the temperature of the amplitude modulation section 504. The offset compensation section 602 changes, in accordance with the temperature of the amplitude modulation section 504 which is measured by the temperature sensor 601, a magnitude of an inputted amplitude signal, thereby compensating for the offset characteristic of the amplitude modulation section 504.

However, in the conventional transmission circuit 600, the magnitude of the inputted amplitude signal is changed in an analogue manner by using analogue components for the temperature sensor 601 and offset compensation section 602. Accordingly, the conventional transmission circuit 600 has a problem that due to inconsistency in characteristic of these analogue components, the offset characteristic of the amplitude modulation section 504 is not properly compensated for, and distortion occurs in a transmission signal.

Another conceivable transmission circuit is a transmission circuit 600a which changes, in a digital manner by using a digital component for the offset compensation section 602, the magnitude of the inputted amplitude signal. FIG. 16 is a block diagram showing an exemplary configuration of the transmission circuit 600a which changes the magnitude of the amplitude signal in a digital manner. In FIG. 16, the transmission circuit 600a comprises the signal generation section 501, the output terminal 502, the amplitude amplifying section 503, the amplitude modulation section 504, the power supply terminal 505, the temperature sensor 601, an offset compensation section 602a, an ADC (Analogue Digital Converter) 603 and a memory 604.

The ADC 603 converts the temperature in the amplitude modulation section 504, which is measured by the temperature sensor 601, to a digital value, and outputs the digital value. The memory 604 stores offset compensation values for compensating for the amplitude signal (e.g., see FIG. 17). The offset compensation section 602a reads, from the memory 604, an offset compensation value corresponding to the digital value, and adds the read offset compensation value to the amplitude signal.

However, also in the transmission circuit 600a, there is a possibility that inconsistency of the digital value outputted from the ADC 603 occurs for the reason that analogue components are used for the temperature sensor 601 and ADC 603. FIG. 18 illustrates the inconsistency of the digital value outputted from the ADC 603. As shown in FIG. 18, there is a possibility that due to a characteristic difference, e.g., an individual difference, of each of the temperature sensor 601 and ADC 603, inconsistency of the digital value outputted from the ADC 603 occurs in accordance with the temperature of the amplitude modulation section 504. For this reason, the transmission circuit 600a also has a problem that the offset characteristic of the amplitude modulation section 504 is not properly compensated for, whereby distortion occurs in a transmission signal.

PCT International Publication WO 2005/104352 (hereinafter, referred to as Patent Document 2) also discloses a transmission circuit which compensates for the offset characteristic of an amplifying element in accordance with a temperature of the amplifying element which corresponds to the aforementioned amplitude modulation section. However, Patent Document 2 does not disclose in detail the manner of compensating for the offset characteristic of the amplifying element in accordance with the temperature in the amplifying element.

SUMMARY OF THE INVENTION

Therefore, an object of the present invention is to provide a transmission circuit, which properly compensates for the offset characteristic of the amplitude modulation section and which operates with low distortion and high efficiency over a wide output power range, and to provide a communication device using the transmission circuit.

The object of the present invention is directed to a transmission circuit for generating and outputting a transmission signal based on input data. In order to achieve the object, the transmission circuit of the present invention comprises: a signal generation section for generating an amplitude signal and an angle-modulated signal in accordance with an amplitude component and a phase component which are obtained by performing signal processing on the input data; an offset compensation section for compensating for a magnitude of the amplitude signal; an amplitude amplifying section for outputting a signal corresponding to the magnitude of the amplitude signal which has been inputted via the offset compensation section to the amplitude amplifier section; an amplitude modulation section for amplitude-modulating the angle-modulated signal by using the signal outputted from the amplitude amplifying section, and outputting a resultant signal as a modulation signal; and a temperature measuring section for measuring a temperature of the amplitude modulation section. The offset compensation section calculates, based on an amount of relative change in temperature of the amplitude modulation section, an offset compensation value for compensating for an offset characteristic of the amplitude modulation section, and adding the calculated offset compensation value to the amplitude signal.

Preferably, the transmission circuit further comprises a memory which prestores offset reference values which are to be references for calculating the offset compensation value, and the memory stores, as the offset reference values: the temperature of the amplitude modulation section in an initial state; the offset compensation value of the amplitude modulation section, which is calculated when the amplitude modulation section is in the initial state; and a rate of change of the offset compensation value with respect to an amount of change in temperature of the amplitude modulation section.

The offset compensation section calculates, based on the offset reference values stored in the memory and the temperature of the amplitude modulation section which is measured by the temperature measuring section, the amount of relative change in temperature of the amplitude modulation section, which change is relative to the temperature of the amplitude modulation section in the initial state, and then multiplies the calculated amount of relative change in temperature by the rate of change of the offset compensation value, thereby calculating the offset compensation value.

Preferably, the temperature measuring section includes a temperature sensor for measuring the temperature of the amplitude modulation section, and an AD converter for performing digital conversion of the temperature of the amplitude modulation section which is measured by the temperature sensor, and outputs a resultant value as a digital value.

Preferably, the transmission circuit further comprises a memory which prestores offset reference values which are to be references for calculating the offset compensation value, and the memory stores, as the offset reference values: the digital value which is outputted from the AD converter when the amplitude modulation section is in an initial state; the offset compensation value which is calculated when the amplitude modulation section is in the initial state; and a rate of change of the offset compensation value with respect to an amount of change in temperature of the amplitude modulation section.

The offset compensation section calculates, based on the offset reference values stored in the memory and the digital value outputted from the AD converter, the amount of relative change in temperature of the amplitude modulation section, which change is relative to the temperature of the amplitude modulation section in the initial state, and then multiplies the calculated amount of relative change in temperature by the rate of change of the offset compensation value, thereby calculating the offset compensation value.

Preferably, the signal generation section includes: a polar coordinate signal generation section for generating the amplitude signal and a phase signal based on the amplitude component and the phase component which are obtained by performing signal processing on the input data; and an angle modulation section for angle-modulating the phase signal and outputting a resultant signal as the angle-modulated signal.

The signal generation section may include: a quadrature signal generation section for generating, by performing signal processing on the input data, an in-phase signal (I signal) and a quadrature-phase signal (Q signal) which are orthogonal to each other; a vector modulation section for vector-modulating the I and Q signals; an envelope detection section for detecting an envelope component of a signal outputted from the vector modulation section, and outputting the detected envelope component as the amplitude signal; and a limiter for limiting, to a predetermined magnitude, the envelope component of the signal outputted from the vector modulation section, and outputting the signal, whose magnitude has been limited, as the angle-modulated signal.

Preferably, the amplitude amplifying section is structured by a series regulator, and supplies, to the amplitude modulation section, a voltage corresponding to the magnitude of the amplitude signal which has been inputted via the offset compensation section to the amplitude amplifying section. Alternatively, the amplitude amplifying section may be structured by a switching regulator, and supply, to the amplitude modulation section, a voltage corresponding to the magnitude of the amplitude signal which has been inputted via the offset compensation section to the amplitude amplifying section.

The signal generation section may further output power information which is set based on a baseband of the transmission circuit. In such a case, the amplitude amplifying section includes a switching regulator and a series regulator. The switching regulator supplies, to the series regulator, a voltage corresponding to the power information. Based on the voltage supplied from the switching regulator, the series regulator supplies, to the amplitude modulation section, a voltage corresponding to the magnitude, compensated for by the offset compensation section, of the amplitude signal.

The memory may store, as the offset reference values: the temperature of the amplitude modulation section in the initial state; the offset compensation value which is calculated when the amplitude modulation section is in the initial state; and rates of change, calculated for respective frequency bands, of the offset compensation value with respect to the amount of change in temperature of the amplitude modulation section.

In this case, the offset compensation section may calculate, based on the offset reference values stored in the memory and the temperature of the amplitude modulation section which is measured by the temperature measuring section, the amount of relative change in temperature of the amplitude modulation section, which change is relative to the temperature of the amplitude modulation section in the initial state, and then multiplies the calculated amount of relative change in temperature by one of the rates of change, which is read from the memory in accordance with a frequency band, of the offset compensation value, thereby calculating the offset compensation value.

Alternatively, the memory may store, as the offset reference values: the temperature of the amplitude modulation section in the initial state; the offset compensation value of the amplitude modulation section, which is calculated when the amplitude modulation section is in the initial state; and rates of change, calculated for respective output powers, of the offset compensation value with respect to the amount of change in temperature of the amplitude modulation section.

In this case, the offset compensation section may calculate, based on the offset reference values stored in the memory and the temperature of the amplitude modulation section which is measured by the temperature measuring section, the amount of relative change in temperature of the amplitude modulation section, which change is relative to the temperature of the amplitude modulation section in the initial state, and then multiplies the calculated amount of relative change in temperature by one of the rates of change, which is read from the memory in accordance with an output power, of the offset compensation value, thereby calculating the offset compensation value.

The amplitude modulation section may be in a multiple-stage structure including at least a first amplitude modulation section and a second amplitude modulation section. In this case, the offset compensation section includes at least a first offset compensation section and a second offset compensation section, each of which compensates for the magnitude of the amplitude signal in accordance with the amount of relative change in temperature of the amplitude modulation section. The amplitude amplifying section includes at least: a first amplitude amplifying section for outputting, to the first amplitude modulation section, a signal corresponding to the magnitude of the amplitude signal which has been inputted via the first offset compensation section to the first amplitude amplifying section; and a second amplitude amplifying section for outputting, to the second amplitude modulation section, a signal corresponding to the magnitude of the amplitude signal which has been inputted via the second offset compensation section to the second amplitude amplifying section. The first amplitude modulation section amplitude-modulates the angle-modulated signal by the signal outputted from the first amplitude amplifying section, and the second amplitude modulation section amplitude-modulates a signal outputted from the first amplitude modulation section by the signal outputted from the second amplitude amplifying section.

The present invention is also directed to a communication device comprising the above-described transmission circuit. The communication device comprises: the transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, in the present invention, the offset compensation section calculates, based on a change in temperature of the amplitude modulation section, which change is relative to the temperature of the amplitude modulation section in the initial state, the offset compensation value for compensating for the amplitude signal. For this reason, even if temperature values, measured by the temperature measuring section, of the amplitude modulation section vary from each other, the offset compensation section is able to calculate an optimal offset compensation value. This enables the transmission circuit to operate with low distortion and high efficiency over a wide output power range.

Further, by using the amplitude amplifying section which is a combination of the series regulator and switching regulator, the present invention is able to reduce loss at the series regulator, thereby reducing power consumption of the transmission circuit over a wide output power range.

Still further, by using the above-described transmission circuit, the communication device of the present invention is able to operate with low distortion and high efficiency over a wide output power range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an exemplary structure of a transmission circuit 1 according to a first embodiment of the present invention;

FIGS. 3A to 3D each show an example of offset reference values stored in a memory 13;

FIG. 4A is a block diagram showing an exemplary structure of an offset compensation section 12a;

FIG. 6A is a block diagram showing an exemplary structure of a series regulator 14a;

FIG. 7A is a block diagram showing an exemplary structure of an amplitude modulation section 15a;

FIG. 9B shows an exemplary output voltage of the series regulator 14a;

FIGS. 11A to 11C each show an example of offset reference values stored in memories 13 and 23;

FIG. 17 shows an example of offset compensation values stored in a memory 604; and FIG. 18 illustrates inconsistency of a digital value outputted from an ADC 603.

DESCRIPTION OF THE PREFERRED EMBODIMENTS

First Embodiment

Figure 2A:
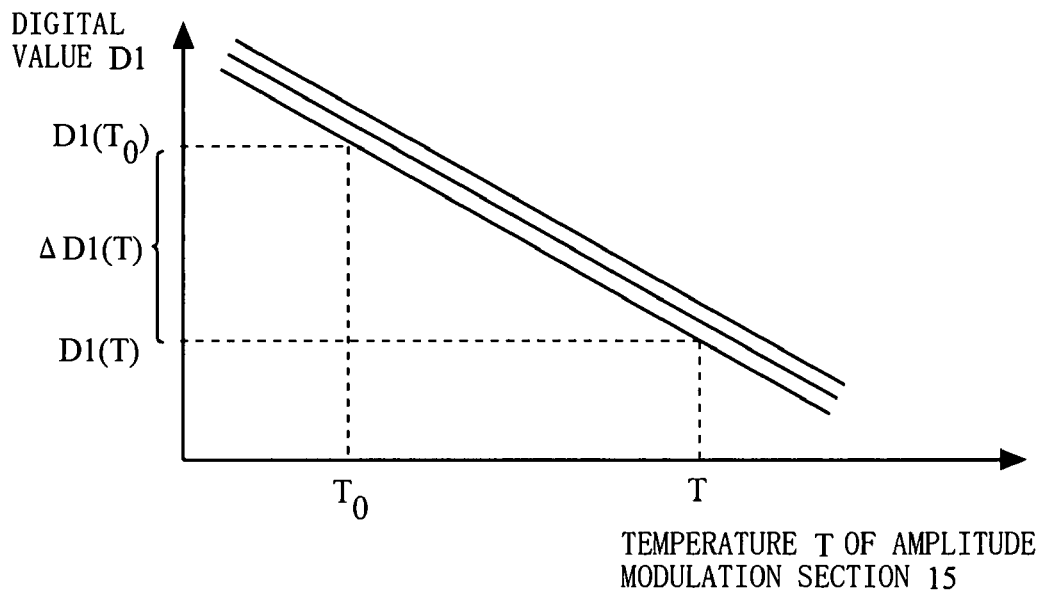
FIG. 2A shows a relationship between a temperature T of an amplitude modulation section 15 and a digital value $D1(T)$ outputted from an ADC 19.

FIG. 1 is a block diagram showing an exemplary structure of a transmission circuit 1 according to a first embodiment of the present invention. In FIG. 1, the transmission circuit 1 comprises a signal generation section 11, offset compensation section 12, memory 13, amplitude amplifying section 14, amplitude modulation section 15, power supply terminal 16, output terminal 17, temperature sensor 18 and an ADC (Analogue Digital Converter) 19.

The signal generation section 11 performs predetermined signal processing on input data, thereby generating an amplitude signal M1 and an angle-modulated signal. The amplitude signal M1 is inputted to an offset compensation section 12. The offset compensation section 12 compensates for the amplitude signal M1, and outputs a resultant signal as an amplitude signal M2. The amplitude signal M2 is inputted to the amplitude amplifying section 14. The amplitude amplifying section 14 is supplied with a DC voltage from the power supply terminal 16. The amplitude amplifying section 14 supplies, to the amplitude modulation section 15, a voltage corresponding to a magnitude of the inputted amplitude signal M2. The amplitude amplifying section 14 typically supplies, to the amplitude modulation section 15, a voltage proportional to the magnitude of the amplitude signal M2. Alternatively, the amplitude amplifying section 14 may supply, to the amplitude modulation section 15, an electric current proportional to the magnitude of the inputted amplitude signal M2. On the other hand, the angle-modulated signal is inputted to the amplitude modulation section 15. The amplitude modulation section 15 amplitude-modulates the angle-modulated signal by using the voltage supplied from the amplitude amplifying section 14, and outputs a resultant signal as a modulation signal having been angle-modulated and amplitude-modulated. The modulation signal is outputted as a transmission signal from the output terminal 17.

The temperature sensor 18 measures a temperature T of the amplitude modulation section 15. The ADC 19 performs digital conversion of the temperature T, measured by the temperature sensor 18, of the amplitude modulation section 15, and outputs a resultant value as a digital value D1(T). Note that, since the temperature sensor 18 and ADC 19 are components for measuring the temperature of the amplitude modulation section 15, these components may be collectively referred to as a temperature measuring section. The memory 13 stores offset reference values which are to be references for calculating an offset compensation value. The offset reference values will be described later in detail. The offset compensation section 12 compensates for the inputted amplitude signal M1, based on the digital value D1(T) outputted from the ADC 19 and the offset reference values stored in the memory 13. To be specific, the offset compensation section 12 calculates, based on the digital value D1(T) and offset reference values, an optimal offset compensation value D2(T). Then, the amplitude signal M1 is compensated for by adding the calculated offset compensation value D2(T) to the amplitude signal M1.

Figure 2B:
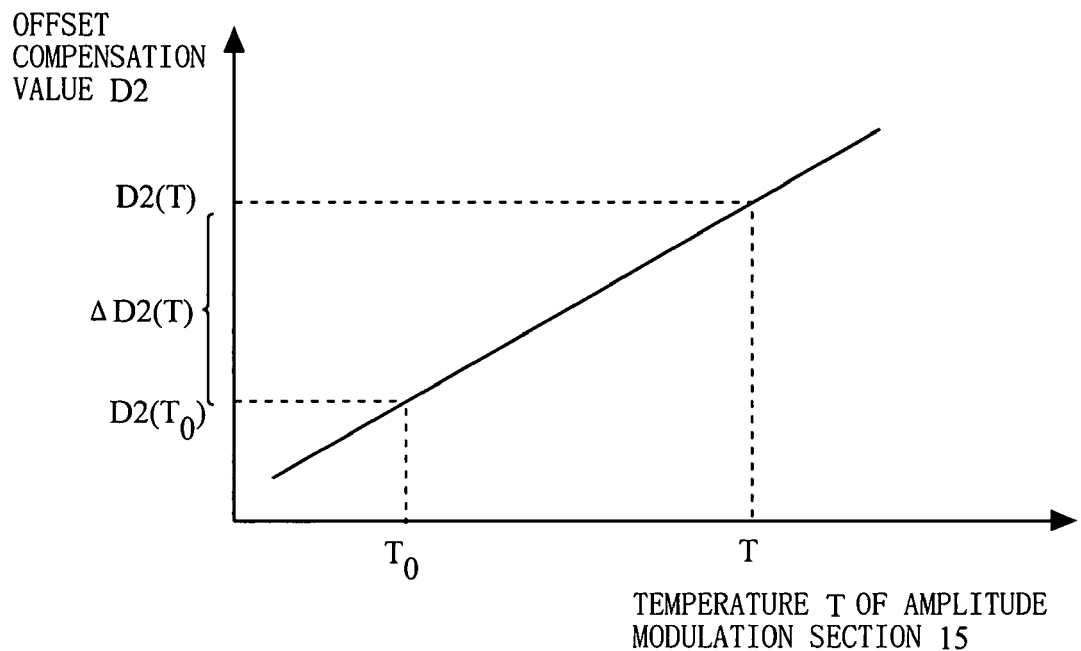
FIG. 2B shows a relationship between the temperature T of the amplitude modulation section 15 and an offset compensation value $D2(T)$.

Hereinafter, a manner, in which the offset compensation section 12 calculates the offset compensation value D2(T), will be described with reference to FIGS. 2A and 2B. FIG. 2A shows a relationship between the temperature T of the amplitude modulation section 15 and the digital value D1(T) outputted from the ADC 19. FIG. 2B shows a relationship between the temperature T of the amplitude modulation section 15 and the offset compensation value D2(T). As shown in FIG. 2A, even if there is inconsistency of the digital value D1(T), a rate of change of the digital value D1(T) (i.e., gradient of the digital value D1(T)) is substantially fixed with respect to the temperature T of the amplitude modulation section 15. As shown in FIG. 2B, a rate of change of the offset compensation value D2(T) (i.e., gradient of the offset compensation value D2(T)) is also substantially fixed with respect to the temperature T of the amplitude modulation section 15.

In other words, a change amount ΔD2(T) of the offset compensation value is approximately proportional to a change amount ΔD1(T) of the digital value, and therefore, the change amount ΔD2(T) of the offset compensation value is representable by an equation (1) presented below. Also, the change amount ΔD1(T) of the digital value and the change amount ΔD2(T) of the offset compensation value are representable by an equation (2) and equation (3), respectively. The offset compensation value D2(T) is representable by an equation (4) based on the equations (1) to (3). In other words, by using the equation (4), the offset compensation section 12 can calculate, from a relative change in temperature of the amplitude modulation section 15, the optimal offset compensation value D2(T).

Figure 3A:
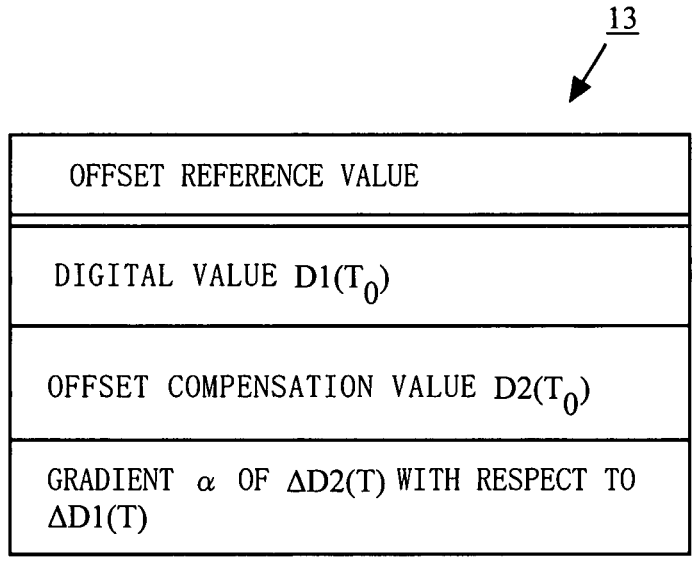
Figure 3B:
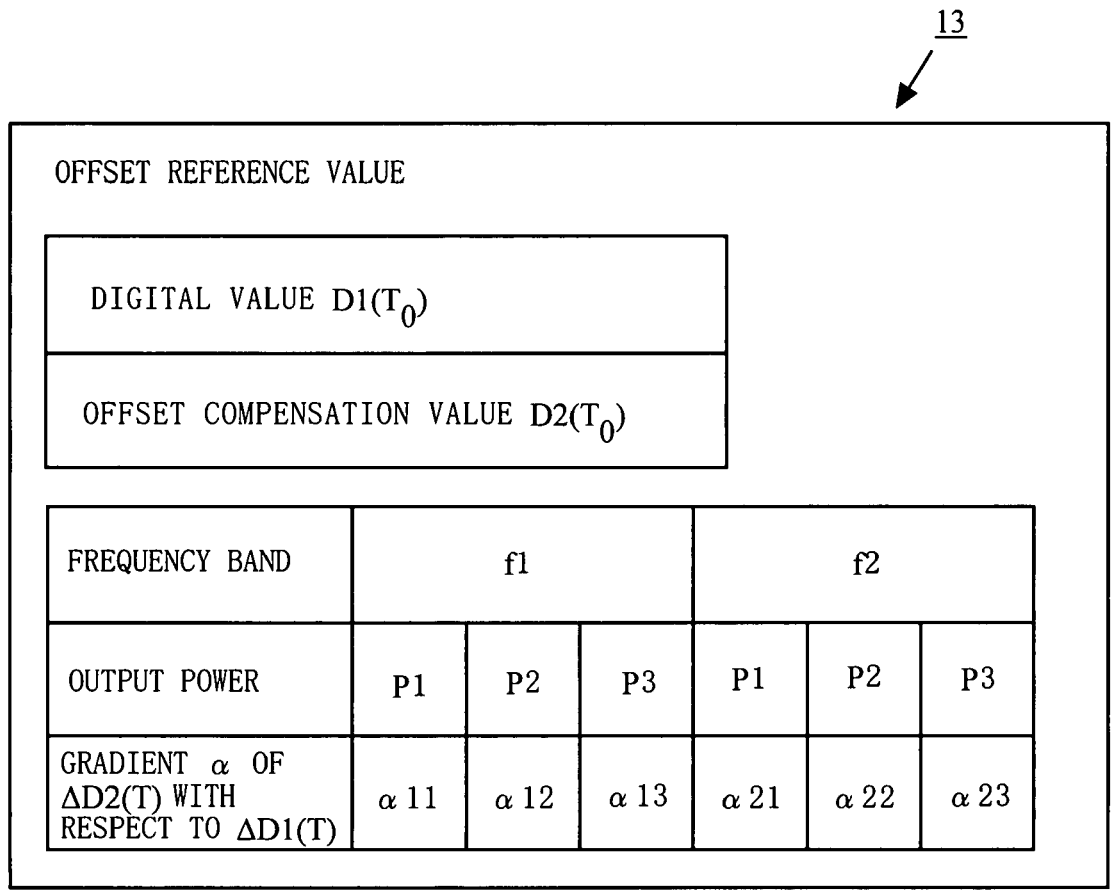

Here, α represents a gradient of ΔD2(T) with respect to ΔD1(T), and $T_0$ represents the temperature of the amplitude modulation section 15 in an initial state. FIG. 3A shows an example of the offset reference values stored in the memory 13. As shown in FIG. 3A, a digital value D1($T_0$), offset compensation value D2($T_0$) and a gradient a of ΔD2(T) with respect to ΔD1(T) are determined at initial setting, and stored in the memory 13 as the offset reference values. Note that, since the offset reference values are used in the offset compensation section 12, the offset compensation section 12 may be structured so as to include the memory 13. Alternatively, the memory 13 may store such offset reference values as shown in FIGS. 3B to 3D. Detailed descriptions will be given later with reference to FIGS. 3B to 3D.

$$\Delta D2(T)=\alpha\Delta D1(T) \quad \text{[equation 1]}$$

$$\Delta D1(T)=D1(T)-D1(T_0) \quad \text{[equation 2]}$$

$$\Delta D2(T)=D2(T)-D2(T_0) \quad \text{[equation 3]}$$

$$D2(T)=D2(T_0)+\alpha(D1(T)-D(T_0)) \quad \text{[equation 4]}$$

Figure 4A:
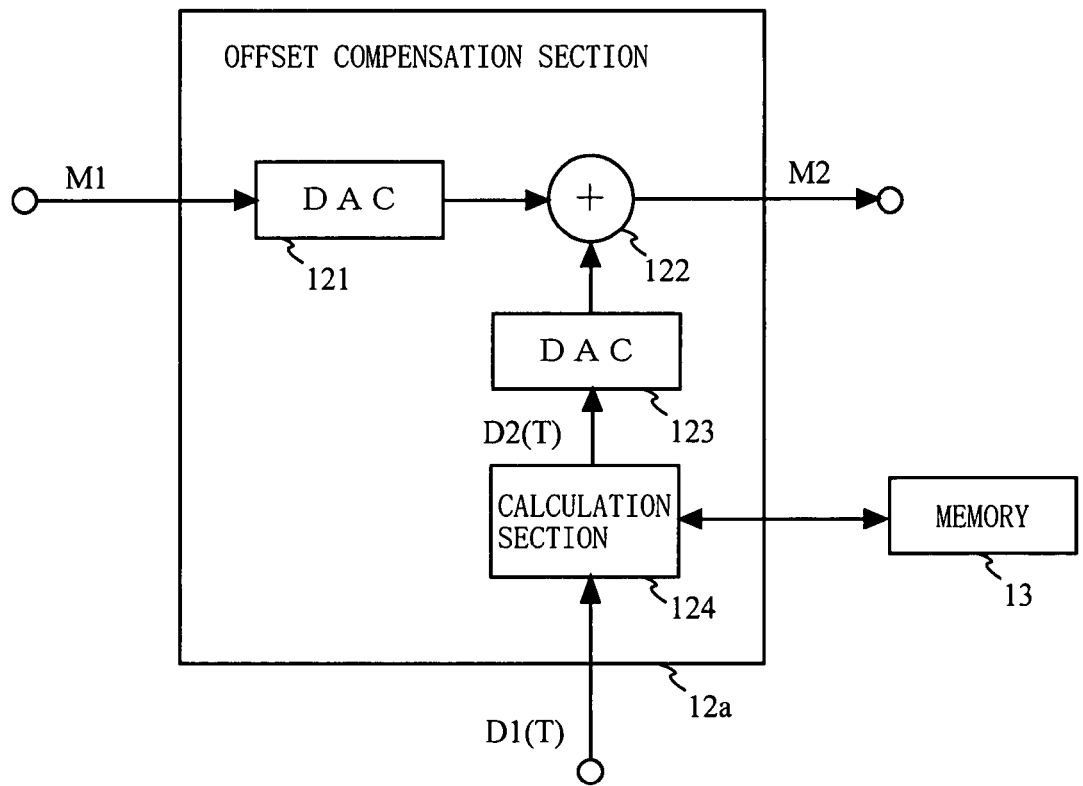

FIG. 4A is a block diagram showing an exemplary structure of an offset compensation section 12a. As shown in FIG. 4A, the offset compensation section 12a includes a DAC 121, adder 122, DAC 123 and a calculation section 124. In the offset compensation section 12a, the digital value D1(T) is inputted from the ADC 19 to the calculation section 124. The calculation section 124 uses the digital value D1(T) and the offset reference values stored in the memory 13, thereby calculating, based on the equation (4), the offset compensation value D2(T). The offset compensation value D2(T) is converted by the DAC 123 into an analogue signal, and inputted to the adder 122. The amplitude signal M1 is converted to an analogue signal by the DAC 121, and added to the offset compensation value D2(T) by the adder 122. Then, a resultant signal is outputted as the amplitude signal M2.

Figure 4B:
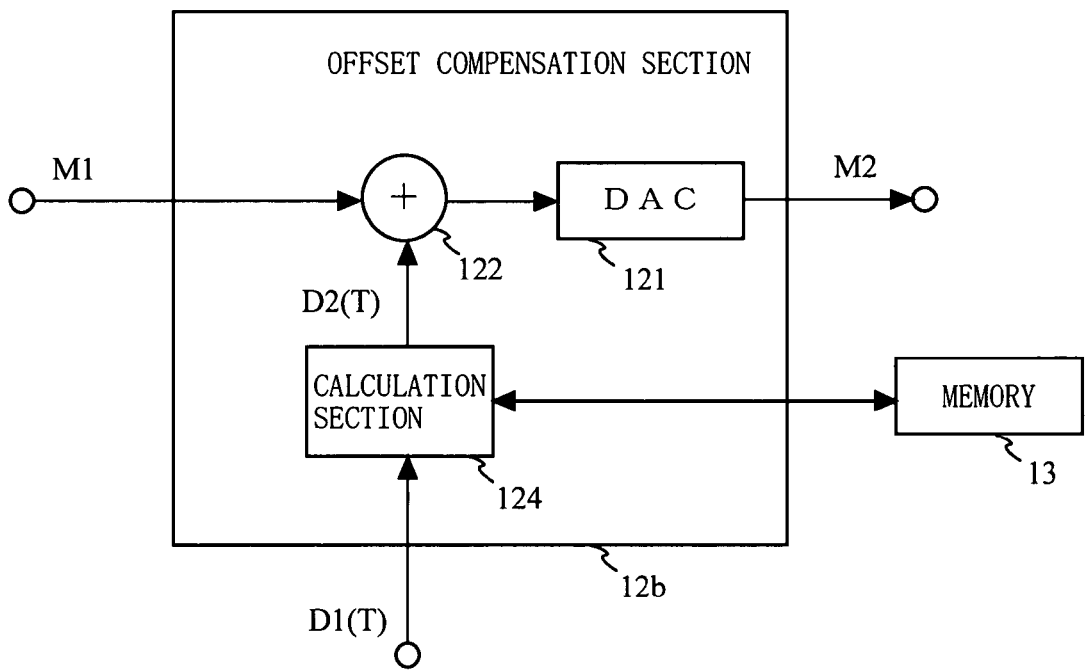
FIG. 4B is a block diagram showing an exemplary structure of an offset compensation section 12b.

Alternatively, the offset compensation section 12 may be structured as shown in FIG. 4B. FIG. 4B is a block diagram showing an exemplary structure of an offset compensation section 12b. As shown in FIG. 4B, the offset compensation section 12b includes the DAC 121, adder 122 and calculation section 124. In the offset compensation section 12b, the amplitude signal M1 is added to the offset compensation value D2(T) by the adder 122, and converted to an analogue signal by the DAC 121. Then, a resultant signal is outputted as the amplitude signal M2.

Figure 5A:
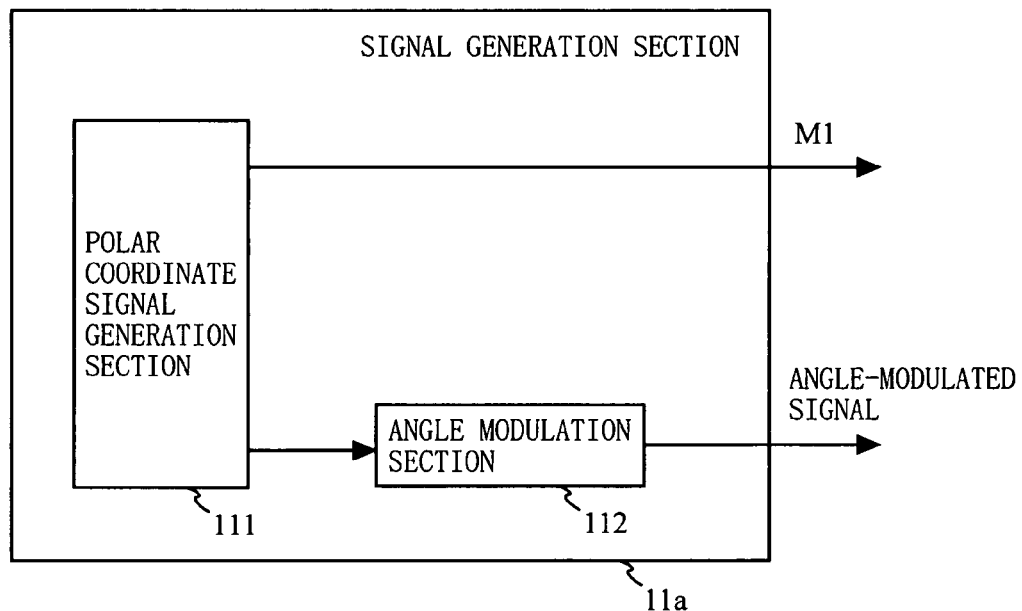
FIG. 5A is a block diagram showing an exemplary structure of a signal generation section 11a in which a polar coordinate signal generation section is used.

The signal generation section 11 may be structured by using, for example, a polar coordinate signal generation section for generating a polar coordinate signal. FIG. 5A is a block diagram showing an exemplary structure of a signal generation section 11a in which a polar coordinate signal generation section is used. As shown in FIG. 5A, the signal generation section 11a includes a polar coordinate signal generation section 111 and an angle modulation section 112. The polar coordinate signal generation section 111 performs signal processing on input data, thereby generating the amplitude signal M1 and a phase signal which are polar coordinate signals. The angle modulation section 112 angle-modulates the phase signal to output the angle-modulated signal.

Figure 5B:
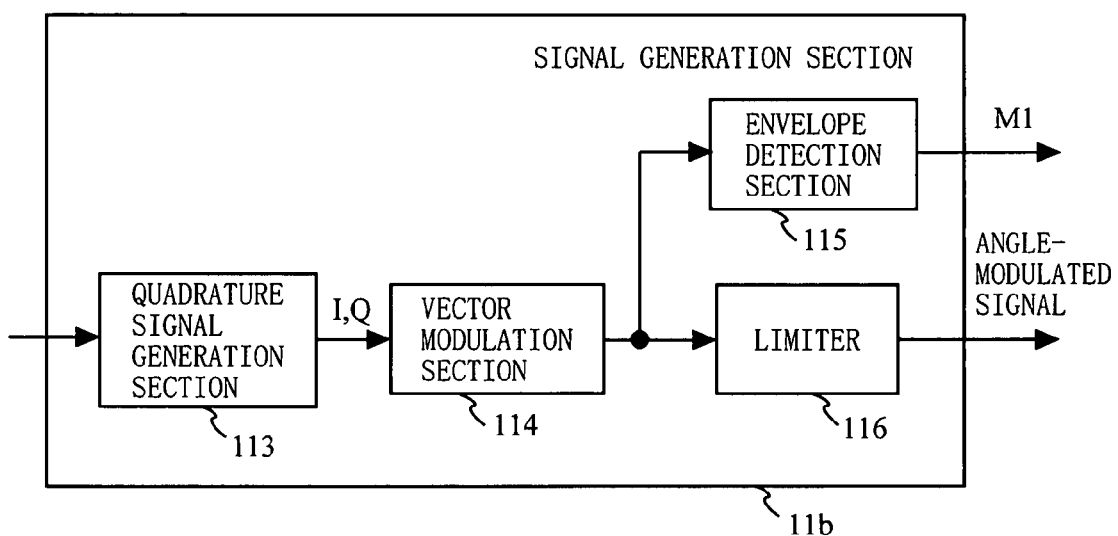
FIG. 5B is a block diagram showing an exemplary structure of a signal generation section 11b in which a quadrature signal generation section is used.

Alternatively, the signal generation section 11 may be structured by using, e.g., a quadrature signal generation section for generating a quadrature signal. FIG. 5B is a block diagram showing an exemplary structure of a signal generation section 11b in which a quadrature signal generation section is used. As shown in FIG. 5B, the signal generation section 11b includes a quadrature signal generation section 113, vector modulation section 114, envelope detection section 115 and a limiter 116. The quadrature signal generation section 113 performs signal processing on input data, thereby generating an in-phase signal (I signal) and a quadrature-phase signal (Q signal) which are orthogonal to each other. The I and Q signals are inputted to the vector modulation section 114. The vector modulation section 114 vector-modulates the I and Q signals. For the vector modulation section 114, a quadrature modulator is used, for example. A signal outputted from the vector modulation section 114 is inputted to the envelope detection section 115 and limiter 116. The envelope detection section 115 detects an envelope component of the signal outputted from the vector modulation section 114, and the detected envelope component is outputted as the amplitude signal M1. The limiter 116 limits, to a particular magnitude, the envelope component of the signal outputted from the vector modulation section 114, and the signal, whose magnitude has been limited, is outputted as the angle-modulated signal.

Figure 6A:
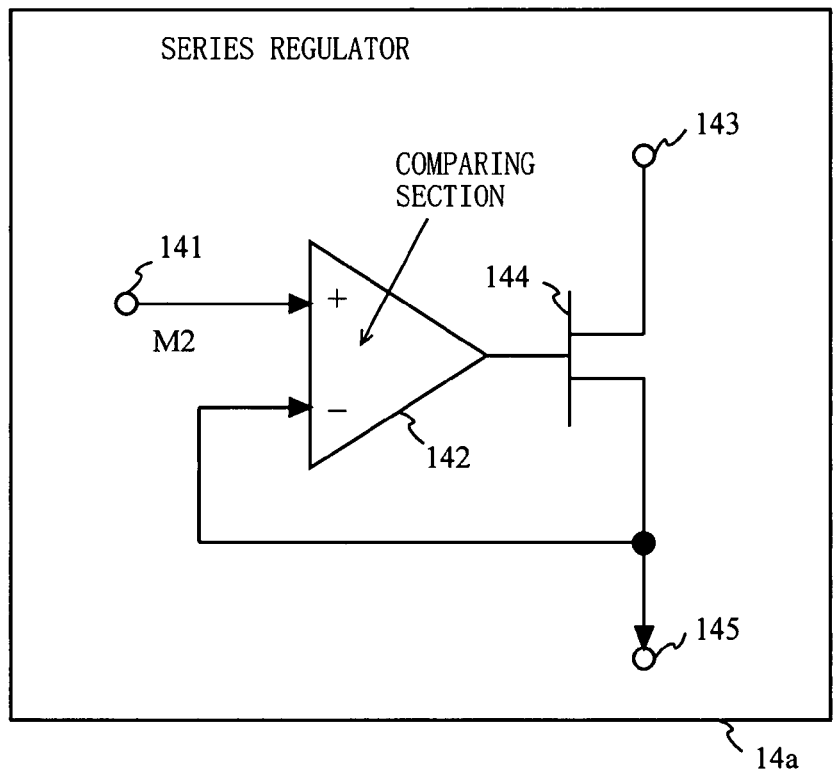

The amplitude amplifying section 14 is structured by, e.g., a series regulator or a switching regulator so as to stably supply a voltage to the amplitude modulation section 15. FIG. 6A is a block diagram showing an exemplary structure of a series regulator 14a. As shown in FIG. 6A, the series regulator 14a includes an input terminal 141, comparing section 142, power supply terminal 143, transistor 144 and an output terminal 145. Here, the transistor 144 is a field effect transistor. The amplitude signal M2 is inputted to the input terminal 141 via the offset compensation section 12. The amplitude signal M2 is then inputted to a gate terminal of the transistor 144 via the comparing section 142. A drain terminal of the transistor 144 is supplied with the DC voltage from the power supply terminal 143.

The transistor 144 outputs, from a source terminal thereof, the voltage proportional to the magnitude of the inputted amplitude signal M2. The voltage outputted from the source terminal of the transistor 144 is fed back to the comparing section 142. The comparing section 142 adjusts, based on the fed back voltage, the magnitude of the amplitude signal M2 to be inputted to the gate terminal of the transistor 144. In this manner, the series regulator 14a stably supplies, from the output terminal 145, the voltage corresponding to the magnitude of the amplitude signal M2. Note that, even if the transistor 144 is a bipolar transistor, the same effect as above is obtained. The transmission circuit 1 is able to operate over a wideband, by using the series regulator 14a for the amplitude amplifying section 14.

Figure 6B:
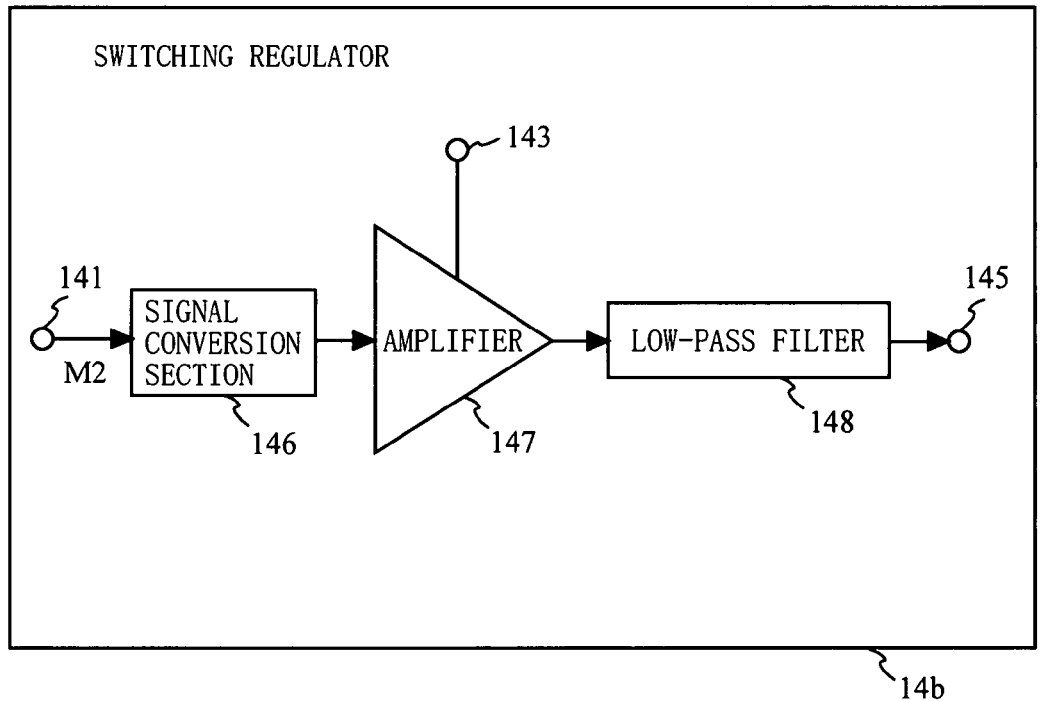
FIG. 6B is a block diagram showing an exemplary structure of a switching regulator 14b.

FIG. 6B is a block diagram showing an exemplary structure of a switching regulator 14b. As shown in FIG. 6B, the switching regulator 14b includes the input terminal 141, the power supply terminal 143, a signal conversion section 146, an amplifier 147, a low-pass filter 148 and the output terminal 145. The amplitude signal M2 is inputted to the input terminal 141 via the offset compensation section 12. The amplitude signal M2 is inputted to the signal conversion section 146. The signal conversion section 146 converts the inputted amplitude signal M2 to a signal having been pulse-width modulated or delta-sigma modulated. The signal resulting from the conversion at the signal conversion section 146 is inputted to the amplifier 147. The amplifier 147 amplifies the inputted signal, and outputs a resultant signal. Here, the amplifier 147 is supplied with the DC voltage from the power supply terminal 143. For the amplifier 147, a high-efficiency switching amplifier such as a D-class amplifier is used.

The signal outputted from the amplifier 147 is inputted to the low-pass filter 148. The low-pass filter 148 removes, from the signal outputted from the amplifier 147, spurious components such as quantization noise and switching noise. The signal, from which spurious components have been removed by the low-pass filter 148, is outputted from the output terminal 145 as the voltage corresponding to the magnitude of the amplitude signal M2. Here, in order to stabilize the voltage to be outputted, the switching regulator 14b may feed back, to the signal conversion section 146, the signal outputted from the low-pass filter 148. The transmission circuit 1 is able to reduce power consumption thereof, by using the switching regulator 14b, which operates with high efficiency, for the amplitude amplifying section 14.

Figure 6C:
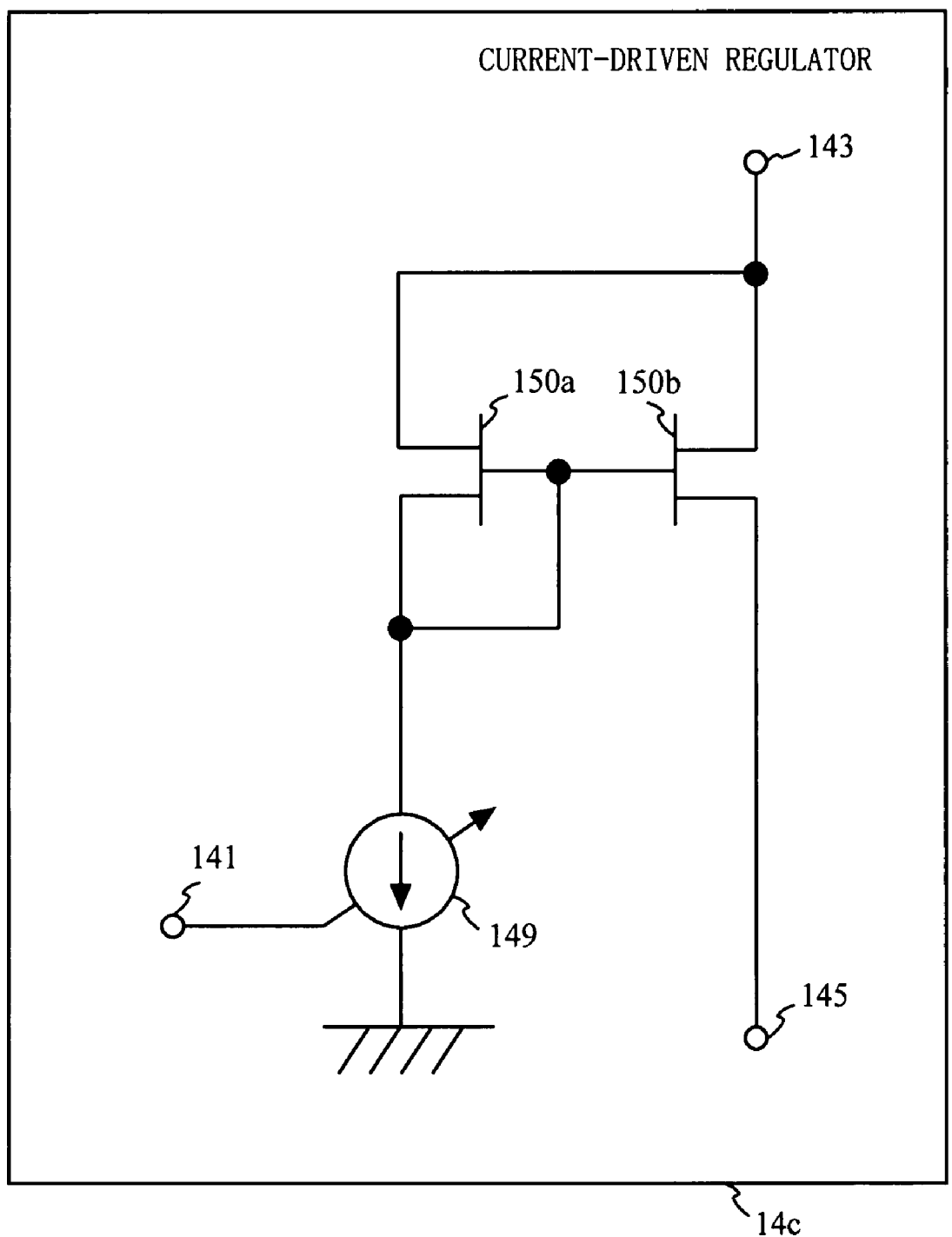
FIG. 6C is a block diagram showing an exemplary structure of a current-driven regulator 14c.

Alternatively, the amplitude amplifying section 14 may be structured by a current-driven regulator. FIG. 6C is a block diagram showing an exemplary structure of a current-driven regulator 14c. As shown in FIG. 6C, the current-driven regulator 14c includes the input terminal 141, the power supply terminal 143, a variable current source 149, a transistor 150a, a transistor 150b and the output terminal 145. The amplitude signal M2 is inputted to the input terminal 141 from the offset compensation section 12. The power supply terminal 143 is supplied with the DC voltage. The amplitude signal M2 inputted via the input terminal 141 is outputted, as an electric current corresponding to the magnitude of the amplitude signal M2, from the output terminal 145 via the variable current source 149, transistor 150a and transistor 150b. The current-driven regulator 14c is useful when the amplitude modulation section 15 is structured by a bipolar transistor. Here, the transistors 150a and 150b may be field effect transistors or bipolar transistors.

Figure 7A:
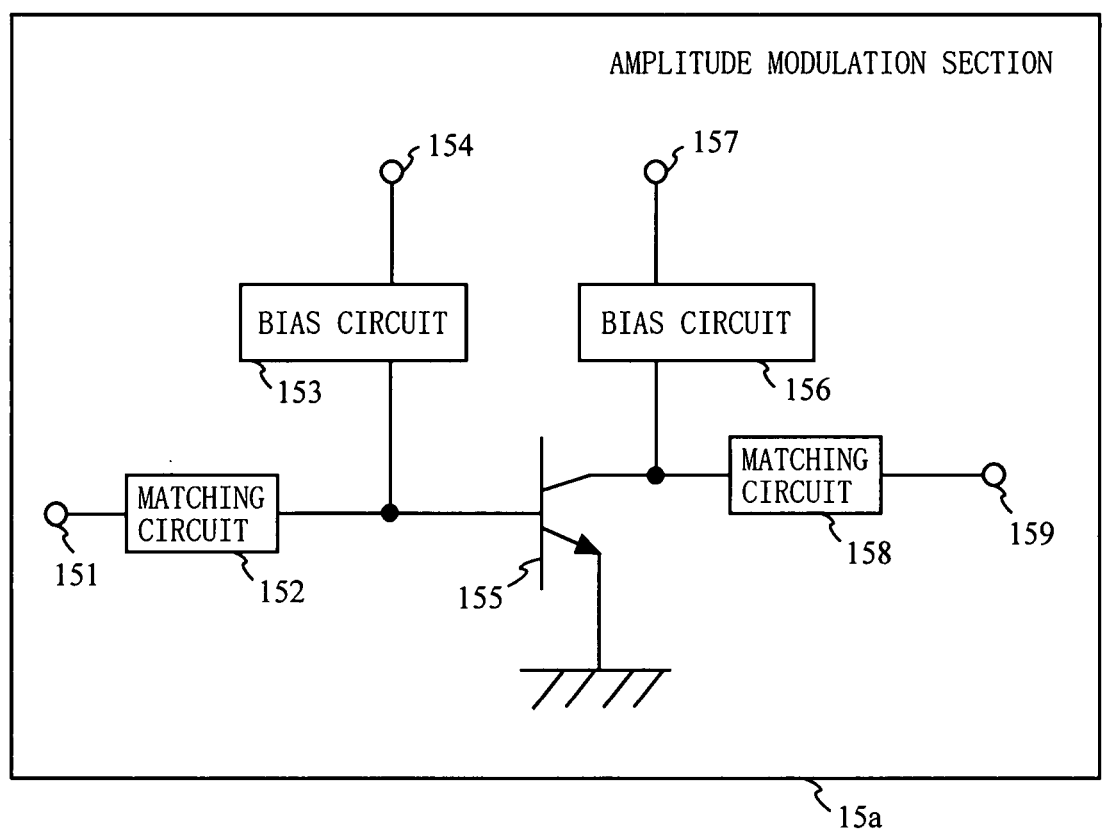

The amplitude modulation section 15 may be structured as shown in, e.g., FIG. 7A. FIG. 7A is a block diagram showing an exemplary structure of an amplitude modulation section 15a. As shown in FIG. 7A, the amplitude modulation section 15a includes an input terminal 151, matching circuit 152, bias circuit 153, power supply terminal 154, transistor 155, bias circuit 156, input terminal 157, matching circuit 158 and an output terminal 159. Here, the transistor 155 is a bipolar transistor. The angle-modulated signal is inputted from the signal generation section 11 to the input terminal 151. The angle-modulated signal is inputted to a base terminal of the transistor 155 via the matching circuit 152.

A DC voltage is applied to the power supply terminal 154. In other words, the base terminal of the transistor 155 is supplied with a bias voltage via the power supply terminal 154 and bias circuit 153. The amplitude amplifying section 14 supplies, to the input terminal 157, the voltage corresponding to the magnitude of the amplitude signal M2. The voltage corresponding to the magnitude of the amplitude signal M2 is supplied to a collector terminal of the transistor 155 via the bias circuit 156. The transistor 155 amplitude-modulates the angle-modulated signal by using the voltage corresponding to the magnitude of the amplitude signal M2, and outputs a resultant signal as the modulation signal.

The modulation signal outputted from the transistor 155 is outputted from the output terminal 159 via the matching circuit 158. Note that, even if the transistor 155 is a field effect transistor, the same effect as described above is obtained. Also, in the amplitude modulation section 15a, signals to be respectively inputted to the power supply terminal 154 and input terminal 157 may be switched to each other. In this case also, the same effect as described above is obtained. Further, when the amplitude amplifying section 14 is structured by the current-driven regulator 14c, the electric current corresponding to the magnitude of the amplitude signal M2 is inputted to the input terminal 157 from the current-driven regulator 14c. In such a case, the electric current corresponding to the magnitude of the amplitude signal M2 is inputted to the collector terminal of the transistor 155 via the bias circuit 156. The transistor 155 amplitude-modulates the angle-modulated signal by using the electric current corresponding to the magnitude of the amplitude signal M2, and outputs a resultant signal as the modulation signal.

Figure 7B:
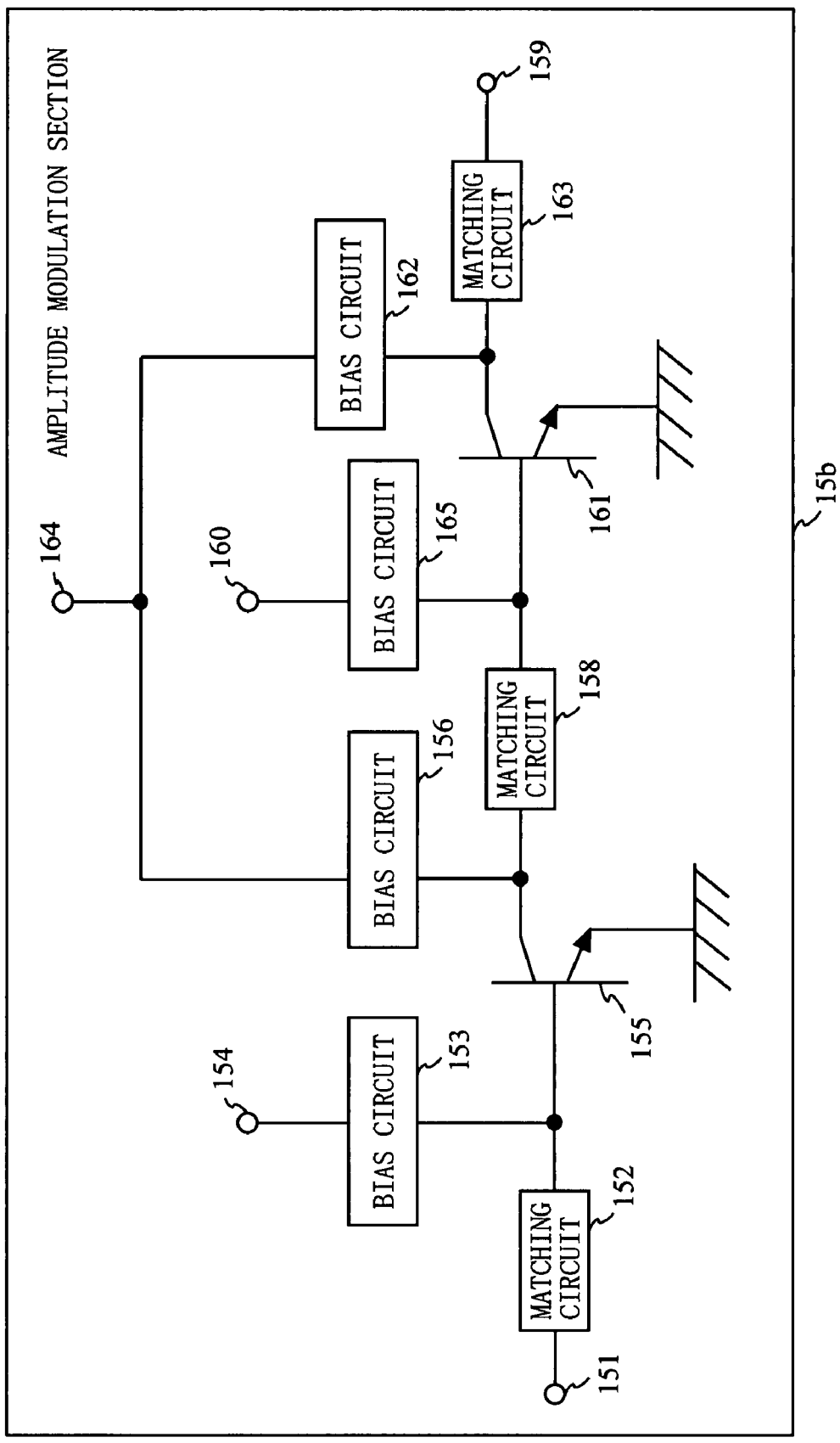
FIG. 7B is a block diagram showing an exemplary structure of an amplitude modulation section 15b.

Note that, the amplitude modulation section 15 may have a different structure from that of the amplitude modulation section 15a. FIG. 7B is a block diagram showing an exemplary structure of an amplitude modulation section 15b. As shown in FIG. 7B, a fundamental structure of the amplitude modulation section 15b is a result of serially connecting two amplitude modulation sections 15a (see FIG. 7A). The base terminal of the transistor 155 is supplied with the bias voltage from the power supply terminal 154 via the bias circuit 153. A base terminal of a transistor 161 is supplied with a bias voltage from a power supply terminal 160 via a bias circuit 165.

The collector terminal of the transistor 155 is supplied with the voltage, which corresponds to the magnitude of the amplitude signal M2, from the amplitude amplifying section 14 via a terminal 164 and the bias circuit 156. Also, a collector terminal of the transistor 161 is supplied with the voltage, which corresponds to the magnitude of the amplitude signal M2, from the amplitude amplifying section 14 via the terminal 164 and a bias circuit 162. By having the above-described structure, the amplitude modulation section 15b is able to output the modulation signal which has a greater dynamic range than that of the modulation signal outputted by the amplitude modulation section 15a shown in FIG. 7. Although the above description describes that transistors of the amplitude modulation sections 15a and 15b are bipolar transistors, the same effects as described above are obtained even if the transistors of the amplitude modulation sections 15a and 15b are field effect transistors. Further, the voltages supplied to the two bias circuits 156 and 162 are not necessarily the same. To be specific, a voltage supplied to one of the bias circuits may be a fixed voltage, and a voltage supplied to the other of the bias circuits may be the voltage corresponding to the magnitude of the amplitude signal M2.

As described above, in the transmission circuit 1 according to the first embodiment of the present invention, the offset compensation section 12 calculates, based on a change in temperature of the amplitude modulation section 15, which change is relative to the temperature of the amplitude modulation section 15 in the initial state, the offset compensation value for compensating for the amplitude signal M1. For this reason, even if temperature values, measured by the temperature measuring section, of the amplitude modulation section 15 vary from each other, the offset compensation section 12 is able to calculate an optimal offset compensation value. This enables the transmission circuit 1 to operate with low distortion and high efficiency over a wide output power range.

Note that, the offset compensation section 12 may calculate the offset compensation value for compensating for the amplitude signal M1, based not only on the change in temperature of the amplitude modulation section 15, which change is relative to the temperature of the amplitude modulation section 15 in the initial state, but also on a frequency band of the amplitude modulation section 15 or a magnitude of output power thereof, for example. In such a case, the memory 13 stores the offset reference values as shown in FIG. 3B. As shown in FIG. 3B, the memory 13 stores, as the offset reference values, the digital value $D1(T_0)$, the offset compensation value $D2(T_0)$ and, in addition, a gradient $\alpha$ of $\Delta D2(T)$ with respect to $\Delta D1(T)$, the gradient a changing in accordance with, e.g., the frequency band and output power magnitude of the amplitude modulation section 15. The offset compensation section 12 refers to the memory 13, thereby reading the gradient α of ΔD2(T) with respect to ΔD1(T), in accordance with the frequency band or output power magnitude of the amplitude modulation section 15.

By assigning, to the above-described equation (4), the gradient α read from the memory 13, the offset compensation section 12 calculates the optimal offset compensation value D2(T) from the relative change in temperature of the amplitude modulation section 15. This allows, even in the case where the offset characteristic of the amplitude modulation section 15 changes in accordance with, e.g., the frequency band and output power magnitude of the amplitude modulation section 15, the transmission circuit 1 to calculate the optimal offset compensation value. Note that, although the memory 13 in FIG. 3B shows the gradient a which changes in accordance with both the frequency band and output power, the memory 13 may store the gradient a which changes in accordance with either one of the frequency band and output power (refer to FIGS. 3C and 3D).

Second Embodiment

Figure 8:
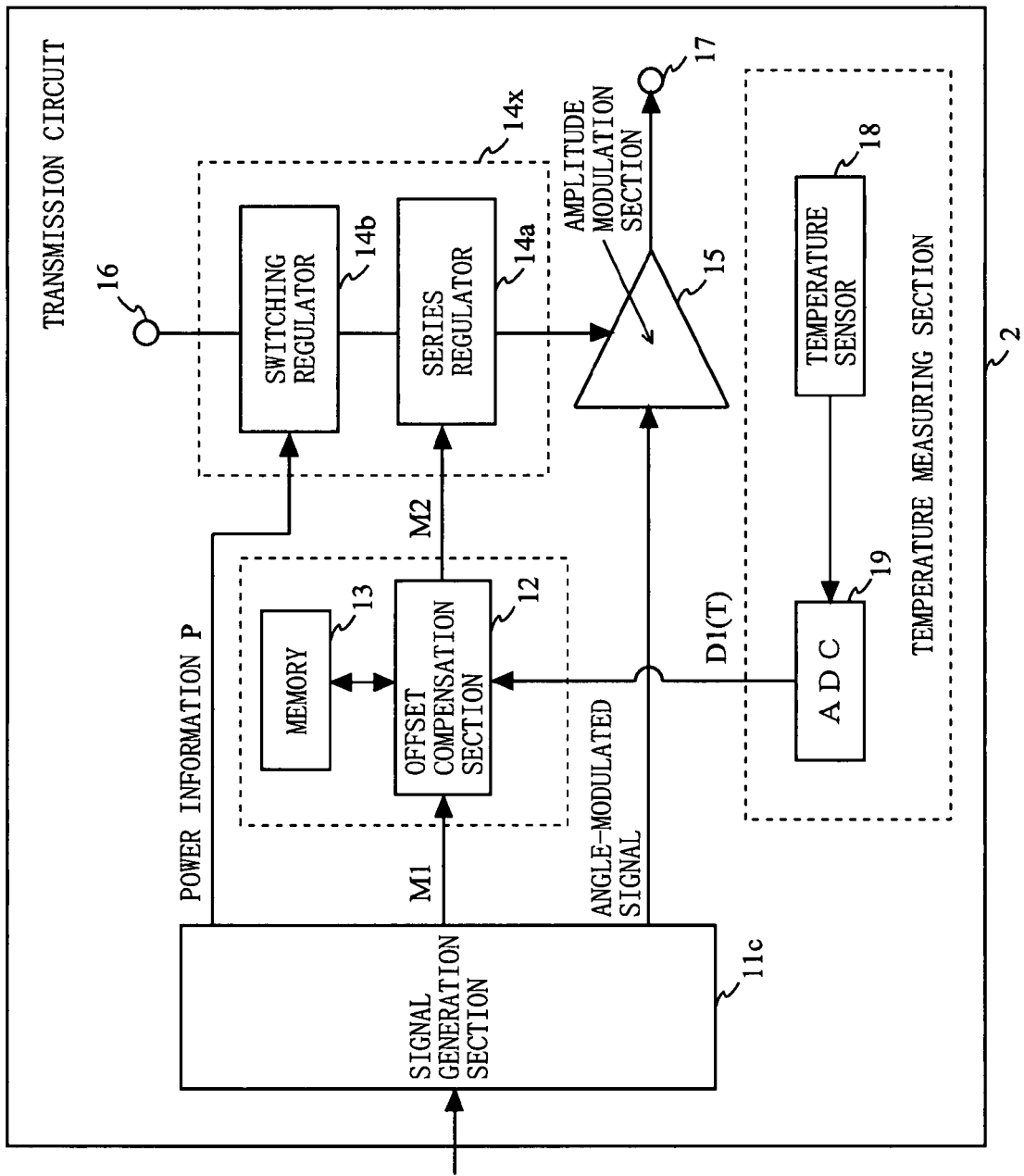
FIG. 8 is a block diagram showing an exemplary structure of a transmission circuit 2 according to a second embodiment of the present invention.

FIG. 8 is a block diagram showing an exemplary structure of a transmission circuit 2 according to a second embodiment of the present invention. As shown in FIG. 8, the transmission circuit 2 is different from the transmission circuit 1 of the first embodiment in that a signal generation section 11c and an amplitude amplifying section 14x have different structures from those of the signal generation section 11 and amplitude amplifying section 14. As compared to the signal generation section 11 according to the first embodiment, the signal generation section 11c further outputs power information P which is set based on a baseband. The amplitude amplifying section 14x includes the series regulator 14a and switching regulator 14b. The series regulator 14a has such a structure as shown in, e.g., FIG. 6A. The switching regulator 14b has such a structure as shown in, e.g., FIG. 6B.

Figure 9A:
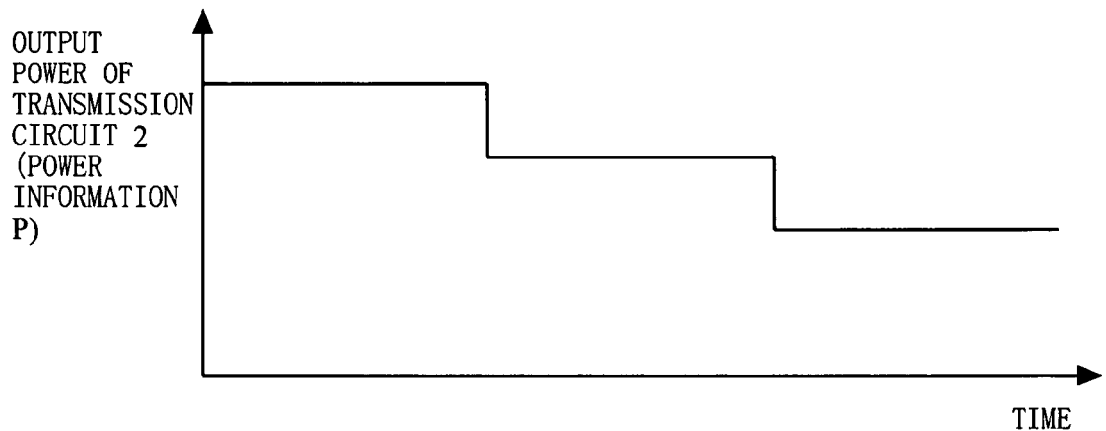
FIG. 9A shows an example of output power, indicated by power information P, of the transmission circuit 2.
Figure 9B:
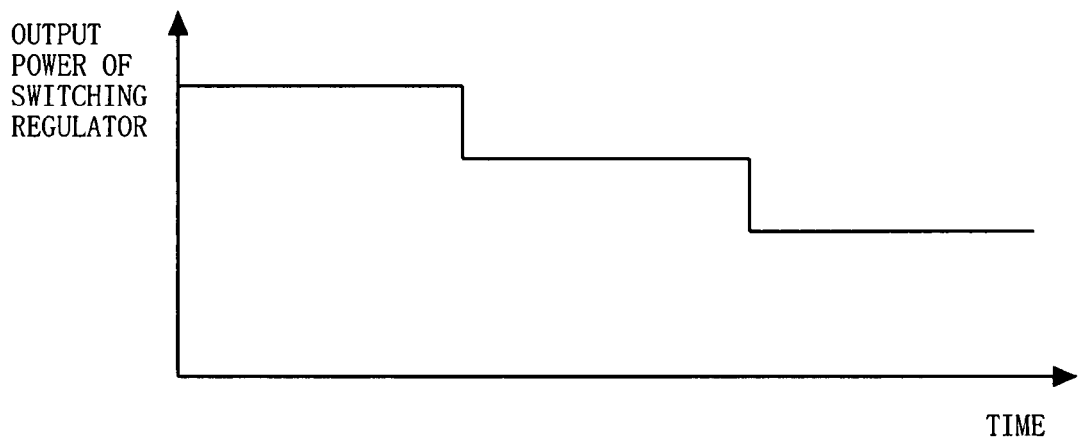
Figure 9C:
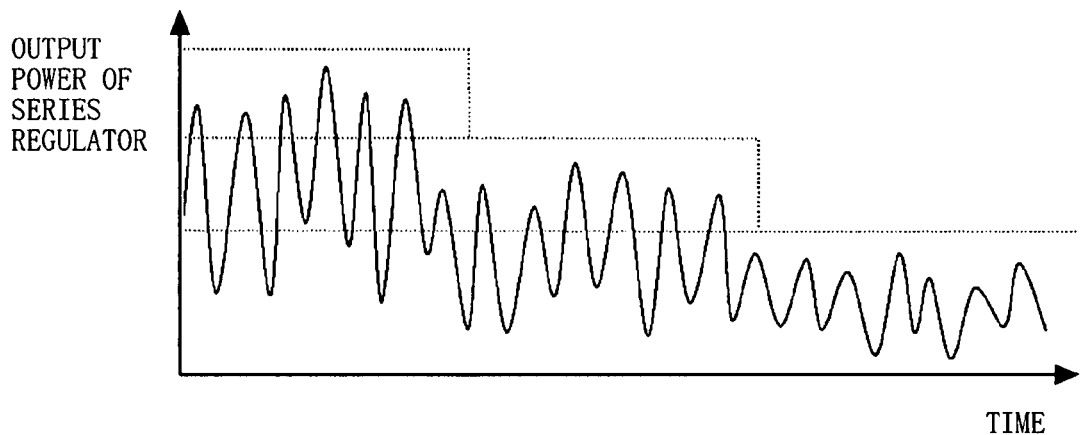
FIG. 9C shows an exemplary output voltage of the switching regulator 14b.

Hereinafter, operations of the transmission circuit 2 will be described with reference to FIGS. 9A to 9C. FIG. 9A shows an example of output power of the transmission circuit 2, which output power is indicated by the power information P. FIG. 9B shows an exemplary output voltage of the series regulator 14a. FIG. 9C shows an exemplary output voltage of the switching regulator 14b. In the case of, e.g., W-CDMA system, the power information P is controlled by a base station. In other words, the base station transmits, to the transmission circuit 2, power with which to perform transmission. In the transmission circuit 2, the signal generation section 11c determines, based on the power transmitted from the base station, the power information P. The power information P is inputted, as information indicating the output power of the transmission circuit 2, to the switching regulator 14b (see FIG. 9A). Note that, the power information P may be inputted to the switching regulator 14b not via the signal generation section 11c but directly from the base station.

The switching regulator 14b is supplied with the DC voltage from the power supply terminal 16. The switching regulator 14b supplies, to the series regulator 14a, a voltage corresponding to the power information P (see FIG. 9B). Since the power information P has a lower frequency than that of the amplitude signal M2, the power information P enables the switching regulator 14b to operate with high efficiency. Note that, the voltage outputted from the switching regulator 14b is set to be equal to or slightly higher than the output voltage from the series regulator 14a.

The series regulator 14a amplifies, by using the voltage supplied from the switching regulator 14b, the amplitude signal M2 inputted via the offset compensation section 12, thereby supplying, to the amplitude modulation section 15, the voltage corresponding to the magnitude of the amplitude signal M2 (see FIG. 9C). Since the voltage supplied from the switching regulator 14b is controlled so as to be at an optimal level, the series regulator 14a is able to operate with high efficiency.

As describe above, the transmission circuit 2 according to the second embodiment of the present invention is able to, by using the amplitude amplifying section 14x which is a combination of the series regulator 14a and switching regulator 14b, reduce loss at the series regulator 14a, and therefore, the transmission circuit 2 is able to reduce power consumption thereof over a wide output power range.

Third Embodiment

Figure 10:
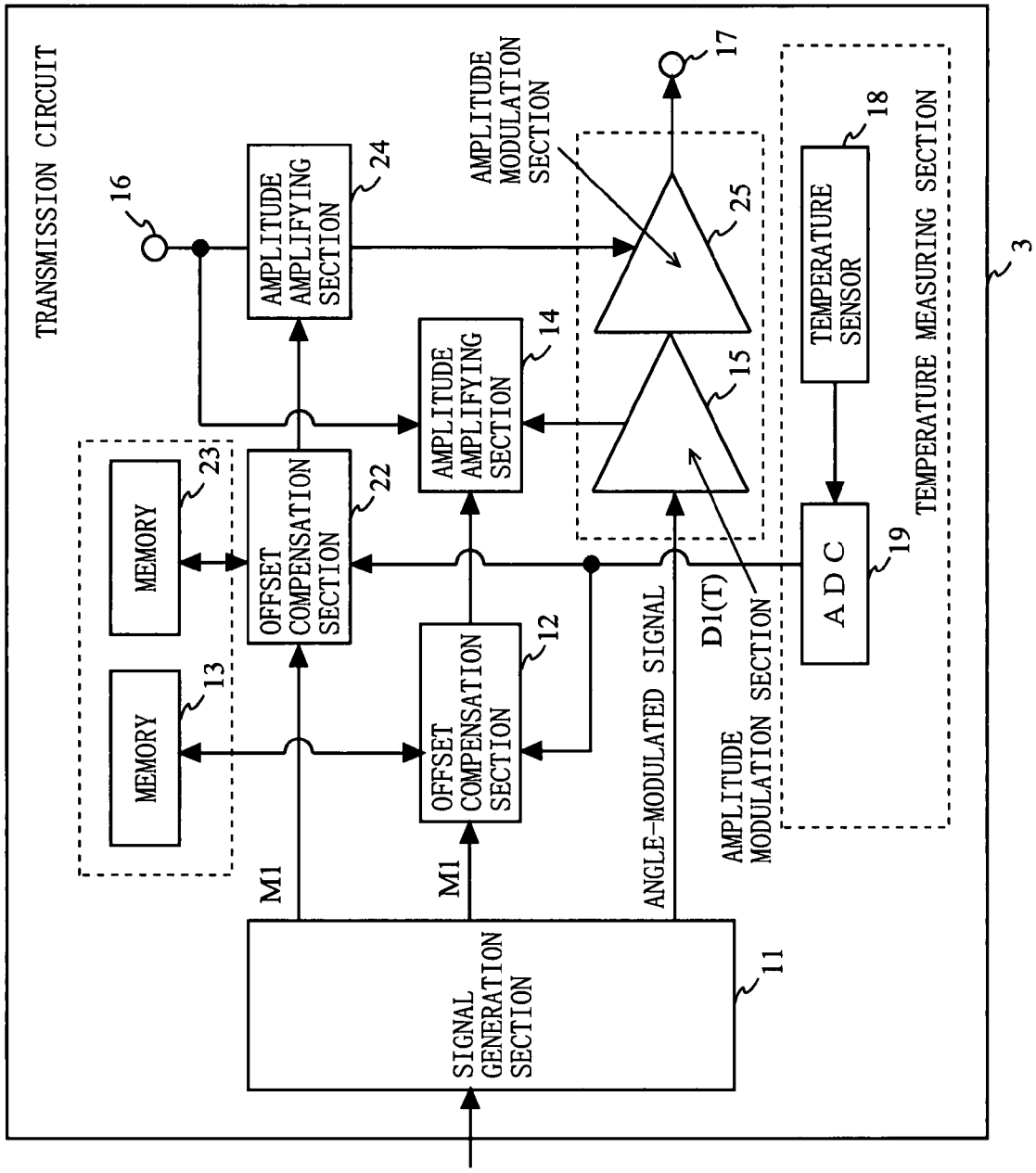
FIG. 10 is a block diagram showing an exemplary structure of a transmission circuit 3 according to a third embodiment of the present invention.

FIG. 10 is a block diagram showing an exemplary structure of a transmission circuit 3 according to a third embodiment of the present invention. As shown in FIG. 10, the transmission circuit 3 is different from the transmission circuit 1 of the first embodiment in that the amplitude modulation section is in a multiple-stage structure, and the offset characteristic of each amplitude modulation section therein is separately compensated for. It is assumed in the example shown in FIG. 3 that the transmission circuit 3 has two amplitude modulation sections (to be specific, a first amplitude modulation section 15 is provided at a previous stage to a second amplitude modulation section 25) which act as the amplitude modulation section in a multiple-stage structure.

FIG. 11A shows examples of offset reference values stored in the memories 13 and 23. As shown in FIG. 11A, the digital value $D1(T_0)$, an offset compensation value $D2d(T_0)$ and a gradient αd of ΔD2d(T) with respect to ΔD1(T), which are applied to the first amplitude modulation section 15, are determined at initial setting, and stored in the memory 13 as offset reference values. Also, the digital value $D1(T_0)$, an offset compensation value $D2f(T_0)$ and a gradient αf of ΔD2f(T) with respect to ΔD1(T), which are applied to the second amplitude modulation section 25, are determined at the initial setting, and stored in the memory 23 as offset reference values. The offset compensation sections 12 and 22 compensate for inputted amplitude signals M1 in accordance with the digital value D1(T) outputted from the ADC 19 and the offset reference values stored in the memories 13 and 23. As a result, even though the amplitude modulation section is in a multiple-stage structure, the transmission circuit 3 is able to separately compensate for the offset characteristic of each amplitude modulation section therein.

The above description describes that the transmission circuit 3 has separately provided memories 13 and 23 for the first amplitude modulation section 15 and the second amplitude modulation section 25, respectively. However, the memories 13 and 23 may be a common memory for the first amplitude modulation section 15 and the second amplitude modulation section 25. Further, as shown in FIG. 11B, the common memory may store, e.g., the digital value $D1(T_0)$ and the offset compensation value $D2(T_0)$ which are common to the first amplitude modulation section 15 and second amplitude modulation section 25 in the initial state.

Still further, the offset compensation sections 12 and 22 may calculate offset compensation values for compensating for amplitude signals M1, based not only on changes in the temperatures of the amplitude modulation sections 15 and 25, which changes are relative to the temperatures of the amplitude modulation sections 15 and 25 in the initial state, but also on, e.g., frequency bands and output power magnitudes of the amplitude modulation sections 15 and 25. In such a case, the memories 13 and 23 store, e.g., such offset reference values as shown in FIG. 11C. As shown in FIG. 11C, the memories 13 and 23 store, as offset reference values, the digital value $D1(T_0)$, the offset compensation value $D2(T_0)$ and, in addition, gradients $\alpha d$ and $\alpha f$ of $\Delta D2(T)$ with respect to $\Delta D1(T)$, the gradients $\alpha d$ and $\alpha f$ changing in accordance with, e.g., the frequency bands and output power magnitudes of the amplitude modulation sections 15 and 25. The offset compensation sections 12 and 22 respectively refer to the memories 13 and 23, thereby reading the gradients $\alpha d$ and $\alpha f$ of $\Delta D2(T)$ with respect to $\Delta D1(T)$, the gradients $\alpha d$ and $\alpha f$ corresponding to, e.g., the frequency bands and output power magnitudes of the amplitude modulation sections 15 and 25. Then, by assigning to the aforementioned equation (4) the gradients $\alpha d$ and $\alpha f$ read from the memories 13 and 23, the offset compensation sections 12 and 22 calculate, based on relative changes in the temperatures of the amplitude modulation section 15 and 25, offset compensation values $D2(T)$ which are optimal for the amplitude modulation sections 15 and 25, respectively. In this manner, the transmission circuit 3 is able to calculate optimal offset compensation values even in the case where the offset characteristics of the amplitude modulation sections 15 and 25 change in accordance with the frequency bands, output power magnitudes and the like of the amplitude modulation sections 15 and 25.

Still further, the above description describes that the transmission circuit 3 is structured so as to compensate for the offset characteristic for both of the amplitude modulation sections 15 and 25. However, the transmission circuit 3 may be structured so as to compensate for the offset characteristic for only either one of the first amplitude modulation section 15 and the second amplitude modulation section 25.

Fourth Embodiment

Figure 12:
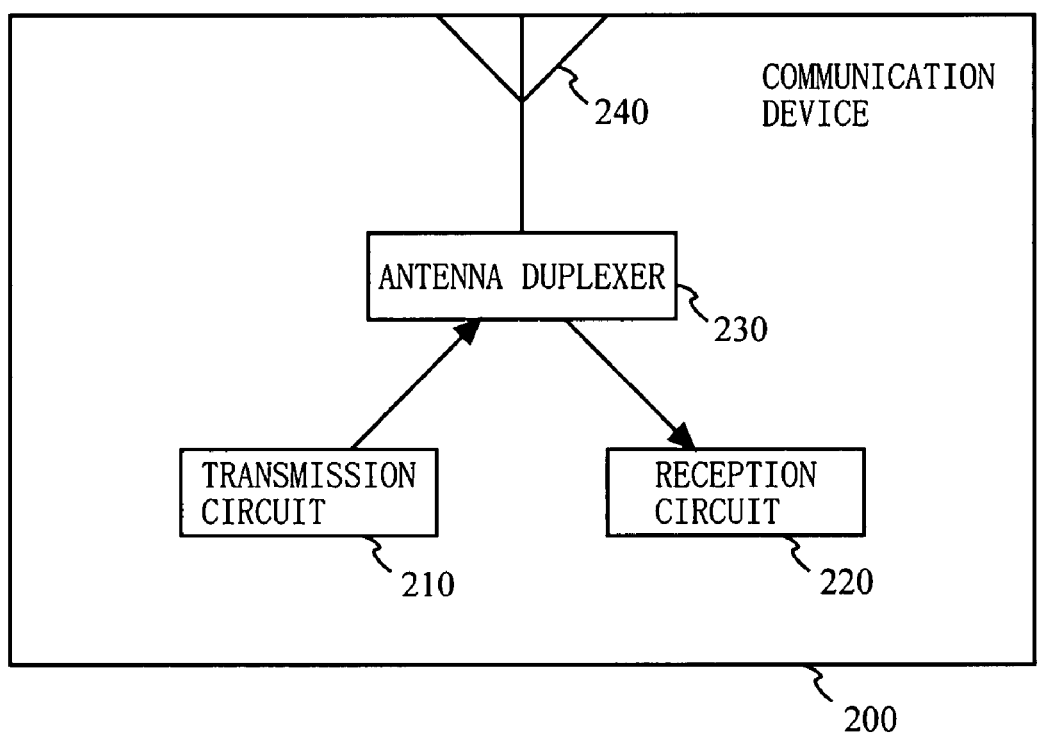
FIG. 12 is a block diagram showing an exemplary structure of a communication apparatus according to a fourth embodiment of the present invention.
Figure 13:
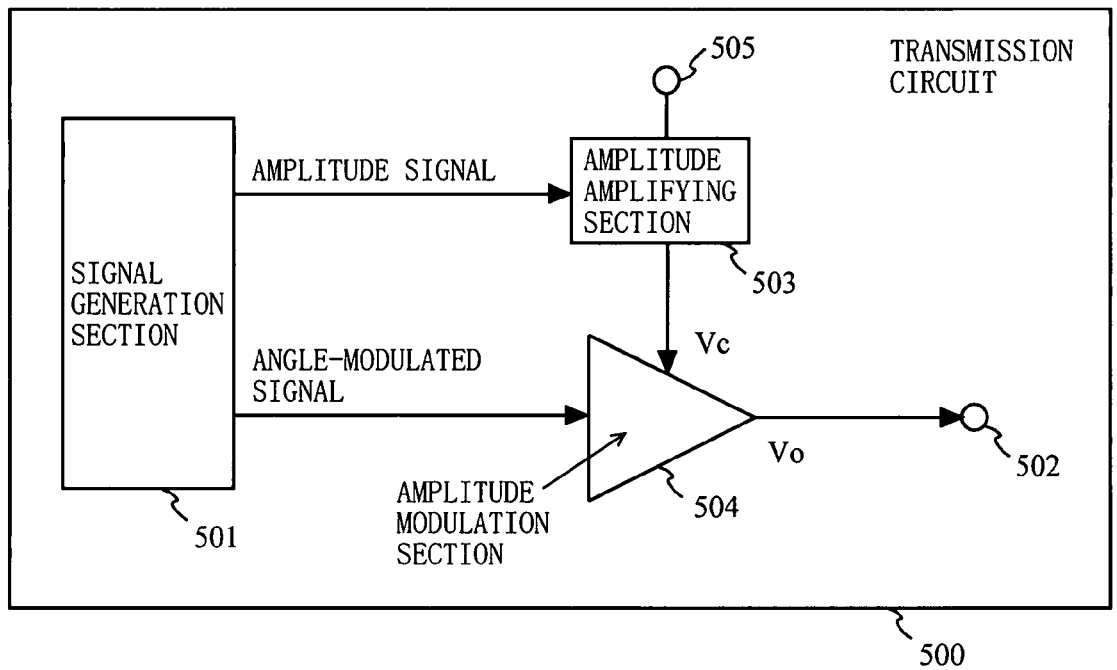
FIG. 13 is a block diagram showing an exemplary structure of a conventional transmission circuit 500.
Figure 14:
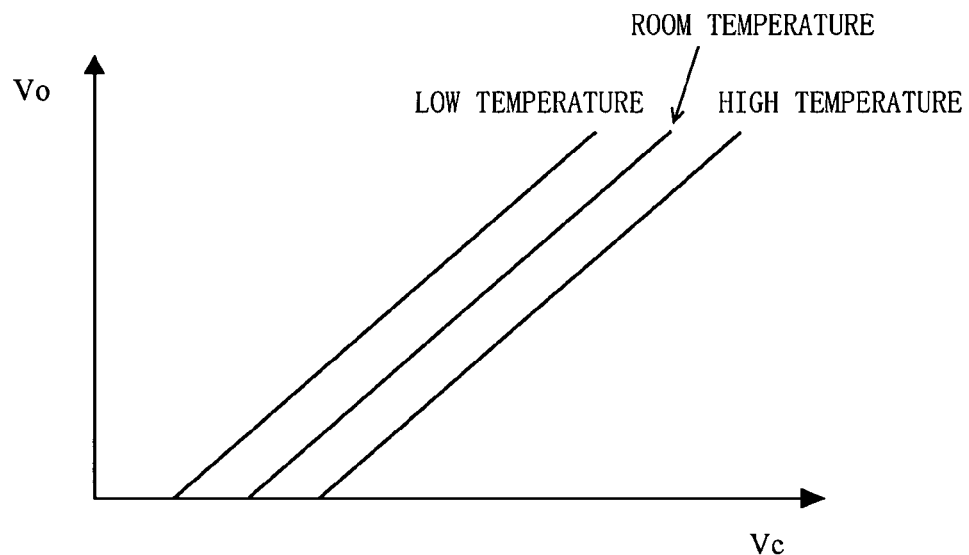
FIG. 14 shows a relationship between a collector voltage Vc supplied to an amplitude modulation section 504 and an output voltage Vo.
Figure 15:
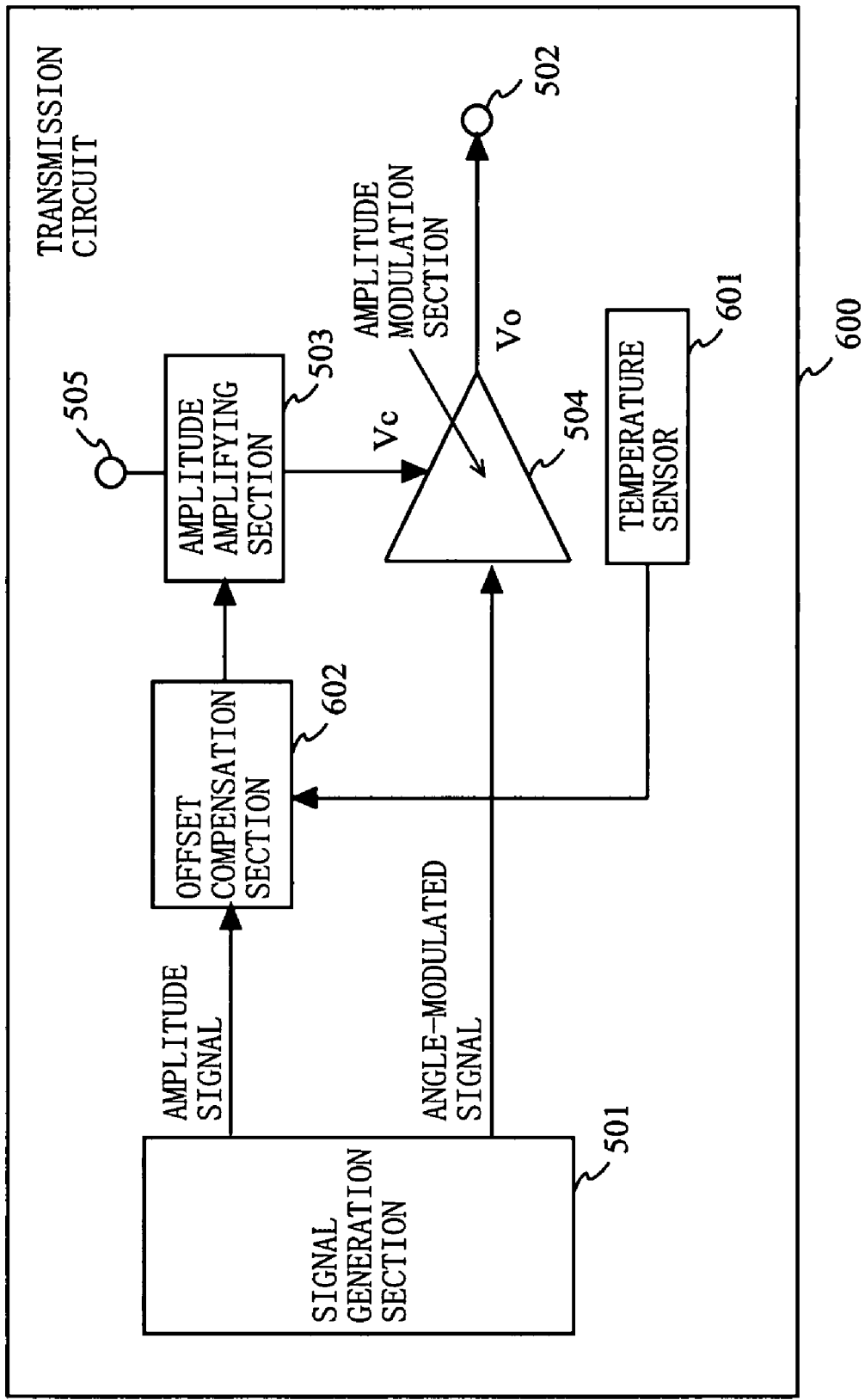
FIG. 15 is a block diagram showing an exemplary structure of a conventional transmission circuit 600.
Figure 16:
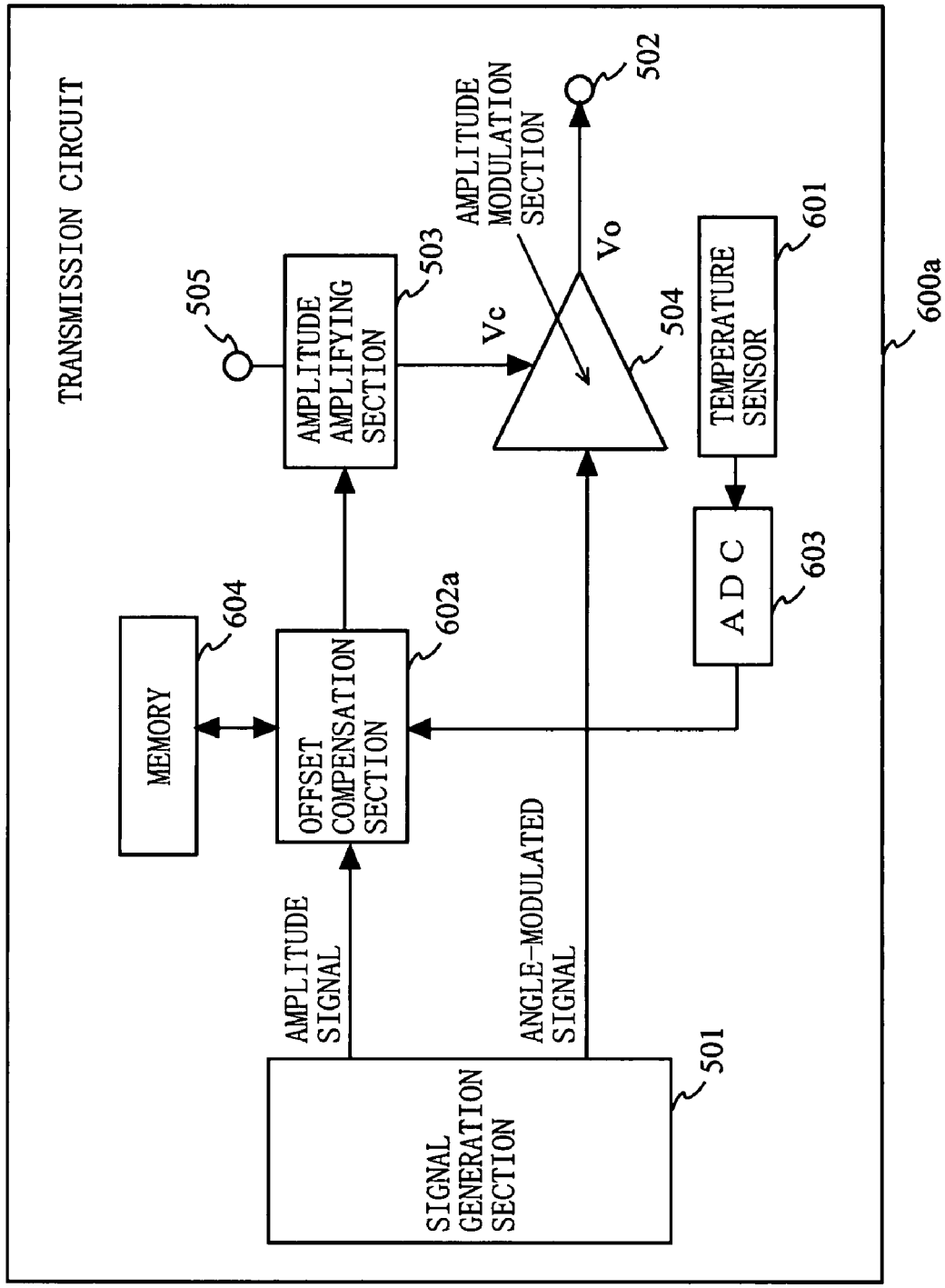
FIG. 16 is a block diagram showing an exemplary structure of a transmission circuit 600a which changes a magnitude of an amplitude signal in a digital manner.

FIG. 12 is a block diagram showing an exemplary configuration of a communication device according to a fourth embodiment of the present invention. As shown in FIG. 12, a communication device 200 according to the fourth embodiment comprises a transmission circuit 210, reception circuit 220, antenna duplexer 230 and an antenna 240. The transmission circuit 210 is any one of the transmission circuits described in the above first to third embodiments. The antenna duplexer 230 transmits to the antenna 240 a transmission signal outputted from the transmission circuit 210, and prevents the transmission signal from leaking to the reception circuit 220. Also, the antenna duplexer 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer 230. The reception signal is received by the antenna 240, and then received by the reception circuit 220 via the antenna duplexer 230. The communication device 200 according to the fourth embodiment uses any of the transmission circuits according to the first to third embodiments, thereby securing the linearity of the transmission signal and also realizing low distortion as a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a configuration which includes only the transmission circuit 210 and antenna 240.

The transmission circuit according to the present invention is applicable to communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A transmission circuit for generating and outputting a transmission signal based on input data, the transmission circuit comprising:
   a signal generation section for generating an amplitude signal and an angle-modulated signal in accordance with an amplitude component and a phase component which are obtained by performing signal processing on the input data;
   an amplitude modulation section for amplitude-modulating the angle-modulated signal and outputting a resultant signal as a modulation signal;
   a temperature measuring section for measuring a temperature of the amplitude modulation section;
   a memory for prestoring offset reference values which are to be references for calculating an offset compensation value, the offset reference values being a temperature of the amplitude modulation section measured at an initial state of the amplitude modulation section, an offset compensation value of the amplitude modulation section calculated when the amplitude modulation section is at the initial state, and a rate of change of offset compensation value with respect to a relative change in temperature of the amplitude modulation section;
   an offset compensation section for compensating for a magnitude of the amplitude signal by (i) calculating an amount of difference between the temperature of the amplitude modulation section at the initial state and a temperature of the amplitude modulation section at a current state measured by the temperature measuring section as the relative change in temperature, (ii) calculating the offset compensation value for compensating for an offset characteristic of the amplitude modulation section using the relative change in temperature, the rate of change of offset compensation value, and the offset compensation value of the amplitude modulation section at the initial state, and (iii) adding the calculated offset compensation value to the amplitude signal; and
   an amplitude amplifying section for receiving the amplitude signal from the offset compensation section and outputting a signal corresponding to the magnitude of the amplitude signal, wherein
   the amplitude modulation section amplitude-modulates the angle-modulated signal by using the signal output from the amplitude amplifying section and outputs the resultant signal as the modulation signal.

2. The transmission circuit according to claim 1, wherein the offset compensation section multiplies the relative change in temperature by the rate of change of offset compensation value to calculate the offset compensation value.

3. The transmission circuit according to claim 1, wherein the temperature measuring section includes
   a temperature sensor for measuring the temperature of the amplitude modulation section, and
   an AD converter for performing digital conversion of the temperature of the amplitude modulation section which is measured by the temperature sensor, and outputting a resultant value as a digital value.

4. The transmission circuit according to claim 3, wherein the memory stores the digital value that is outputted from the AD converter when the amplitude modulation section is at the initial state as the temperature of the amplitude modulation section measured at the initial state.

5. The transmission circuit according to claim 4, wherein the offset compensation section multiplies the relative change in temperature by the rate of change offset compensation value to calculate the offset compensation value.

6. The transmission circuit according to claim 1, wherein the signal generation section includes:
   a polar coordinate signal generation section for generating the amplitude signal and a phase signal based on the amplitude component and the phase component which are obtained by performing signal processing on the input data; and
   an angle modulation section for angle-modulating the phase signal and outputting a resultant signal as the angle-modulated signal.

7. The transmission circuit according to claim 1, wherein the signal generation section includes:
   a quadrature signal generation section for generating, by performing signal processing on the input data, an in-phase signal (I signal) and a quadrature-phase signal (Q signal) which are orthogonal to each other;
   a vector modulation section for vector-modulating the I and Q signals;
   an envelope detection section for detecting an envelope component of a signal outputted from the vector modulation section, and outputting the detected envelope component as the amplitude signal; and
   a limiter for limiting, to a predetermined magnitude, the envelope component of the signal outputted from the vector modulation section, and outputting the signal, whose magnitude has been limited, as the angle-modulated signal.

8. The transmission circuit according to claim 1, wherein the amplitude amplifying section comprises a series regulator, and supplies, to the amplitude modulation section, a voltage as the signal corresponding to the magnitude of the amplitude signal which has been inputted via the offset compensation section to the amplitude amplifying section.

9. The transmission circuit according to claim 1, wherein the amplitude amplifying section comprises a switching regulator, and supplies, to the amplitude modulation section, a voltage as the signal corresponding to the magnitude of the amplitude signal which has been inputted via the offset compensation section to the amplitude amplifying section.

10. The transmission circuit according to claim 1, wherein
    the signal generation section further outputs power information which is set based on a baseband of the transmission circuit,
    the amplitude amplifying section includes a switching regulator and a series regulator,
    the switching regulator supplies, to the series regulator, a voltage corresponding to the power information, and
    based on the voltage supplied from the switching regulator, the series regulator supplies, to the amplitude modulation section, a voltage as the signal corresponding to the magnitude, compensated for by the offset compensation section, of the amplitude signal.

11. The transmission circuit according to claim 1, wherein the memory stores a plurality of rates of change of offset compensation value, calculated for respective frequency bands, with respect to the relative change in temperature of the amplitude modulation section.

12. The transmission circuit according to claim 11, wherein the offset compensation section multiplies the relative change in temperature by one of the rates of change of offset compensation value, which is read from the memory in accordance with a frequency band, to calculate the offset compensation value.

13. The transmission circuit according to claim 1, wherein the memory stores a plurality of rates of change of offset compensation value, calculated for respective output powers, with respect to the relative change in temperature of the amplitude modulation section.

14. The transmission circuit according to claim 13, wherein the offset compensation section multiplies the relative change in temperature by one of the rates of change of offset compensation value, which is read from the memory in accordance with an output power, to calculate the offset compensation value.

15. The transmission circuit according to claim 1, wherein
    the amplitude modulation section is in a multiple-stage structure including at least a first amplitude modulation section and a second amplitude modulation section,
    the offset compensation section includes at least a first offset compensation section and a second offset compensation section, each of which compensates for the magnitude of the amplitude signal in accordance with the amount of relative change in temperature of the amplitude modulation section,
    the amplitude amplifying section includes at least: a first amplitude amplifying section for outputting, to the first amplitude modulation section, a signal corresponding to the magnitude of the amplitude signal which has been inputted via the first offset compensation section to the first amplitude amplifying section; and a second amplitude amplifying section for outputting, to the second amplitude modulation section, a signal corresponding to the magnitude of the amplitude signal which has been inputted via the second offset compensation section to the second amplitude amplifying section, and
    the first amplitude modulation section amplitude-modulates the angle-modulated signal by the signal outputted from the first amplitude amplifying section, and the second amplitude modulation section amplitude-modulates a signal outputted from the first amplitude modulation section by the signal outputted from the second amplitude amplifying section.

16. A communication device comprising:
    a transmission circuit for generating a transmission signal; and
    an antenna for outputting the transmission signal generated by the transmission circuit, wherein
    the transmission circuit is the transmission circuit according to claim 1.

17. The communication device according to claim 16, further comprising:
    a reception circuit for processing a reception signal received from the antenna; and
    an antenna duplexer for outputting the transmission signal generated by the transmission circuit to the antenna, and outputting the reception signal received from the antenna to the reception circuit.

* * * * *